(12) United States Patent
Sekelsky

(10) Patent No.: US 9,824,597 B2
(45) Date of Patent: Nov. 21, 2017

(54) MAGNETIC NAVIGATION METHODS AND SYSTEMS UTILIZING POWER GRID AND COMMUNICATION NETWORK

(71) Applicant: Lockheed Martin Corporation, Bethesda, MD (US)

(72) Inventor: Stephen M. Sekelsky, Princeton, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 49 days.

(21) Appl. No.: 15/003,206

(22) Filed: Jan. 21, 2016

(65) Prior Publication Data

US 2017/0110015 A1    Apr. 20, 2017

Related U.S. Application Data

(60) Provisional application No. 62/109,006, filed on Jan. 28, 2015, provisional application No. 62/109,551, filed on Jan. 29, 2015.

(51) Int. Cl.
| | |
|---|---|
| *G08G 5/00* | (2006.01) |
| *B64C 39/02* | (2006.01) |
| *G05D 1/02* | (2006.01) |
| *G05D 1/04* | (2006.01) |
| *G01R 33/032* | (2006.01) |

(52) U.S. Cl.
CPC ......... *G08G 5/0069* (2013.01); *B64C 39/024* (2013.01); *G01R 33/032* (2013.01); *G05D 1/0202* (2013.01); *G05D 1/042* (2013.01)

(58) Field of Classification Search
CPC .. G08G 5/0069; B64C 39/024; G01R 33/032; G05D 1/0202; G05D 1/042
See application file for complete search history.

(56) References Cited

U.S. PATENT DOCUMENTS

| | | |
|---|---|---|
| 2,746,027 A | 5/1956 | Murray |
| 3,359,812 A | 12/1967 | Everitt |
| 3,389,333 A | 6/1968 | Wolff et al. |
| 3,490,032 A * | 1/1970 | Zurflueh ............ G01R 33/025 324/331 |
| 3,514,723 A | 5/1970 | Cutler |
| 3,518,531 A | 6/1970 | Huggett |
| 3,745,452 A | 7/1973 | Osburn et al. |
| 3,899,758 A | 8/1975 | Maier et al. |
| 4,025,873 A | 5/1977 | Chilluffo |
| 4,078,247 A | 3/1978 | Albrecht |
| 4,084,215 A | 4/1978 | Willenbrock |

(Continued)

FOREIGN PATENT DOCUMENTS

| | | |
|---|---|---|
| CN | 105738845 A | 7/2016 |
| DE | 69608006 T2 | 2/2001 |

(Continued)

OTHER PUBLICATIONS

U.S. Appl. No. 14/659,498, filed Mar. 16, 2015.

(Continued)

*Primary Examiner* — Calvin Cheung
(74) *Attorney, Agent, or Firm* — Foley & Lardner LLP

(57) ABSTRACT

Methods and configurations are disclosed for exploiting characteristic magnetic signature of electrical power transmission and distribution lines for navigation.

48 Claims, 9 Drawing Sheets

(56) References Cited

U.S. PATENT DOCUMENTS

| | | | |
|---|---|---|---|
| 4,322,769 A | 3/1982 | Cooper |
| 4,329,173 A | 5/1982 | Culling |
| 4,359,673 A | 11/1982 | Bross et al. |
| 4,368,430 A | 1/1983 | Dale et al. |
| 4,410,926 A | 10/1983 | Hafner et al. |
| 4,437,533 A | 3/1984 | Bierkarre et al. |
| 4,514,083 A | 4/1985 | Fukuoka |
| 4,588,993 A | 5/1986 | Babij et al. |
| 4,636,612 A | 1/1987 | Cullen |
| 4,638,324 A | 1/1987 | Hannan |
| 4,675,522 A | 6/1987 | Arunkumar |
| 4,768,962 A | 9/1988 | Kupfer et al. |
| 4,818,990 A | 4/1989 | Fernandes |
| 4,820,986 A | 4/1989 | Mansfield et al. |
| 4,945,305 A | 7/1990 | Blood |
| 4,958,328 A | 9/1990 | Stubblefield |
| 5,019,721 A | 5/1991 | Martens et al. |
| 5,038,103 A | 8/1991 | Scarzello et al. |
| 5,113,136 A | 5/1992 | Hayashi et al. |
| 5,134,369 A | 7/1992 | Lo et al. |
| 5,189,368 A | 2/1993 | Chase |
| 5,200,855 A | 4/1993 | Meredith et al. |
| 5,245,347 A | 9/1993 | Bonta et al. |
| 5,252,912 A | 10/1993 | Merritt et al. |
| 5,301,096 A | 4/1994 | Klontz et al. |
| 5,384,109 A | 1/1995 | Klaveness et al. |
| 5,396,802 A | 3/1995 | Moss |
| 5,420,549 A | 5/1995 | Prestage |
| 5,425,179 A | 6/1995 | Nickel et al. |
| 5,427,915 A | 6/1995 | Ribi et al. |
| 5,548,279 A * | 8/1996 | Gaines | B64D 45/00 324/117 R |
| 5,568,516 A | 10/1996 | Strohallen et al. |
| 5,586,069 A | 12/1996 | Dockser |
| 5,597,762 A | 1/1997 | Popovici et al. |
| 5,638,472 A | 6/1997 | Van Delden |
| 5,694,375 A | 12/1997 | Woodall |
| 5,719,497 A | 2/1998 | Veeser et al. |
| 5,731,996 A | 3/1998 | Gilbert |
| 5,764,061 A | 6/1998 | Asakawa et al. |
| 5,818,352 A | 10/1998 | McClure |
| 5,846,708 A | 12/1998 | Hollis et al. |
| 5,888,925 A | 3/1999 | Smith et al. |
| 5,907,420 A | 5/1999 | Chraplyvy et al. |
| 5,907,907 A | 6/1999 | Ohtomo et al. |
| 6,042,249 A | 3/2000 | Spangenberg |
| 6,057,684 A | 5/2000 | Murakami et al. |
| 6,124,862 A | 9/2000 | Boyken et al. |
| 6,130,753 A | 10/2000 | Hopkins et al. |
| 6,144,204 A | 11/2000 | Sementchenko |
| 6,195,231 B1 | 2/2001 | Sedlmayr et al. |
| 6,360,173 B1 | 3/2002 | Fullerton |
| 6,398,155 B1 | 6/2002 | Hepner et al. |
| 6,433,944 B1 | 8/2002 | Nagao et al. |
| 6,472,651 B1 | 10/2002 | Ukai |
| 6,472,869 B1 | 10/2002 | Upschulte et al. |
| 6,504,365 B2 | 1/2003 | Kitamura |
| 6,542,242 B1 | 4/2003 | Yost et al. |
| 6,621,578 B1 | 9/2003 | Mizoguchi |
| 6,636,146 B1 | 10/2003 | Wehoski |
| 6,686,696 B2 | 2/2004 | Mearini et al. |
| 6,690,162 B1 | 2/2004 | Schopohl et al. |
| 6,765,487 B1 | 7/2004 | Holmes et al. |
| 6,788,722 B1 | 9/2004 | Kennedy et al. |
| 6,809,829 B1 | 10/2004 | Takata et al. |
| 7,118,657 B2 | 10/2006 | Golovchenko et al. |
| 7,221,164 B1 * | 5/2007 | Barringer | G01V 3/165 324/330 |
| 7,277,161 B2 | 10/2007 | Claus |
| 7,305,869 B1 | 12/2007 | Berman et al. |
| 7,307,416 B2 | 12/2007 | Islam et al. |
| RE40,343 E | 5/2008 | Anderson |
| 7,413,011 B1 | 8/2008 | Chee et al. |
| 7,427,525 B2 | 9/2008 | Santori et al. |
| 7,448,548 B1 | 11/2008 | Compton |
| 7,471,805 B2 | 12/2008 | Goldberg |
| 7,474,090 B2 | 1/2009 | Islam et al. |
| 7,543,780 B1 | 6/2009 | Marshall et al. |
| 7,546,000 B2 | 6/2009 | Spillane et al. |
| 7,570,050 B2 | 8/2009 | Sugiura |
| 7,608,820 B1 | 10/2009 | Berman et al. |
| 7,705,599 B2 | 4/2010 | Strack et al. |
| 7,805,030 B2 | 9/2010 | Bratkovski et al. |
| 7,916,489 B2 | 3/2011 | Okuya |
| 7,983,812 B2 | 7/2011 | Potter |
| 8,022,693 B2 | 9/2011 | Meyersweissflog |
| 8,120,351 B2 | 2/2012 | Rettig et al. |
| 8,120,355 B1 | 2/2012 | Stetson |
| 8,138,756 B2 | 3/2012 | Barclay et al. |
| 8,193,808 B2 | 6/2012 | Fu et al. |
| 8,294,306 B2 | 10/2012 | Kumar et al. |
| 8,311,767 B1 * | 11/2012 | Stetson | G01R 33/032 702/152 |
| 8,334,690 B2 | 12/2012 | Kitching et al. |
| 8,415,640 B2 | 4/2013 | Babinec et al. |
| 8,471,137 B2 | 6/2013 | Adair et al. |
| 8,480,653 B2 | 7/2013 | Birchard et al. |
| 8,525,516 B2 | 9/2013 | Le Prado et al. |
| 8,547,090 B2 | 10/2013 | Lukin et al. |
| 8,574,536 B2 | 11/2013 | Boudou et al. |
| 8,575,929 B1 | 11/2013 | Wiegert |
| 8,686,377 B2 | 4/2014 | Twitchen et al. |
| 8,758,509 B2 | 6/2014 | Twitchen et al. |
| 8,803,513 B2 | 8/2014 | Hosek et al. |
| 8,885,301 B1 | 11/2014 | Heidmann |
| 8,913,900 B2 | 12/2014 | Lukin et al. |
| 8,933,594 B2 | 1/2015 | Kurs |
| 8,947,080 B2 | 2/2015 | Lukin et al. |
| 8,963,488 B2 | 2/2015 | Campanella et al. |
| 9,103,873 B1 | 8/2015 | Martens et al. |
| 9,157,859 B2 | 10/2015 | Walsworth et al. |
| 9,245,551 B2 | 1/2016 | El Hallak et al. |
| 9,249,526 B2 | 2/2016 | Twitchen et al. |
| 9,291,508 B1 | 3/2016 | Biedermann et al. |
| 9,369,182 B2 | 6/2016 | Kurs et al. |
| 9,541,610 B2 | 1/2017 | Kaup et al. |
| 9,551,763 B1 | 1/2017 | Hahn et al. |
| 9,557,391 B2 | 1/2017 | Egan et al. |
| 9,570,793 B2 | 2/2017 | Borodulin |
| 9,590,601 B2 | 3/2017 | Krause et al. |
| 9,614,589 B1 | 4/2017 | Russo et al. |
| 9,680,338 B2 | 6/2017 | Malpas et al. |
| 9,689,679 B2 | 6/2017 | Budker et al. |
| 9,720,055 B1 | 8/2017 | Hahn et al. |
| 2002/0144093 A1 | 10/2002 | Inoue et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |
| 2003/0098455 A1 | 5/2003 | Amin et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |
| 2004/0042150 A1 | 3/2004 | Swinbanks et al. |
| 2004/0081033 A1 | 4/2004 | Arieli et al. |
| 2004/0109328 A1 | 6/2004 | Dahl et al. |
| 2004/0247145 A1 | 12/2004 | Luo et al. |
| 2005/0031840 A1 | 2/2005 | Swift et al. |
| 2005/0068249 A1 | 3/2005 | Du Toit et al. |
| 2005/0099177 A1 | 5/2005 | Greelish |
| 2005/0112594 A1 | 5/2005 | Grossman |
| 2005/0126905 A1 | 6/2005 | Golovchenko et al. |
| 2005/0130601 A1 | 6/2005 | Palermo et al. |
| 2005/0134257 A1 | 6/2005 | Etherington et al. |
| 2005/0138330 A1 | 6/2005 | Owens et al. |
| 2005/0146327 A1 | 7/2005 | Jakab |
| 2006/0012385 A1 | 1/2006 | Tsao et al. |
| 2006/0054789 A1 | 3/2006 | Miyamoto et al. |
| 2006/0055584 A1 * | 3/2006 | Waite | G01S 13/86 342/22 |
| 2006/0062084 A1 | 3/2006 | Drew |
| 2006/0071709 A1 | 4/2006 | Maloberti et al. |
| 2006/0247847 A1 * | 11/2006 | Carter | A47F 10/04 701/498 |
| 2006/0255801 A1 | 11/2006 | Ikeda |

(56) References Cited

U.S. PATENT DOCUMENTS

| | | |
|---|---|---|
| 2006/0291771 A1 | 12/2006 | Braunisch et al. |
| 2007/0004371 A1 | 1/2007 | Okanobu |
| 2007/0247147 A1 | 10/2007 | Xiang et al. |
| 2007/0273877 A1 | 11/2007 | Kawano et al. |
| 2008/0016677 A1 | 1/2008 | Creighton, IV |
| 2008/0048640 A1 | 2/2008 | Hull et al. |
| 2008/0078233 A1 | 4/2008 | Larson et al. |
| 2008/0089367 A1 | 4/2008 | Srinivasan et al. |
| 2008/0204004 A1 | 8/2008 | Anderson |
| 2008/0217516 A1 | 9/2008 | Suzuki et al. |
| 2008/0239265 A1 | 10/2008 | Den Boef |
| 2008/0253264 A1 | 10/2008 | Nagatomi et al. |
| 2008/0266050 A1 | 10/2008 | Crouse et al. |
| 2008/0299904 A1 | 12/2008 | Yi et al. |
| 2009/0042592 A1 | 2/2009 | Cho et al. |
| 2009/0058697 A1 | 3/2009 | Aas et al. |
| 2009/0060790 A1 | 3/2009 | Okaguchi et al. |
| 2009/0079417 A1 | 3/2009 | Mort et al. |
| 2009/0079426 A1* | 3/2009 | Anderson ........ G01R 31/31709 324/301 |
| 2009/0132100 A1 | 5/2009 | Shibata |
| 2009/0157331 A1 | 6/2009 | Van Netten |
| 2009/0195244 A1 | 8/2009 | Mouget et al. |
| 2009/0222208 A1 | 9/2009 | Speck |
| 2009/0277702 A1 | 11/2009 | Kanada et al. |
| 2009/0310650 A1 | 12/2009 | Chester et al. |
| 2010/0004802 A1 | 1/2010 | Bodin et al. |
| 2010/0015438 A1 | 1/2010 | Williams et al. |
| 2010/0015918 A1 | 1/2010 | Liu et al. |
| 2010/0045269 A1 | 2/2010 | Lafranchise et al. |
| 2010/0071904 A1 | 3/2010 | Burns et al. |
| 2010/0102809 A1 | 4/2010 | May |
| 2010/0134922 A1 | 6/2010 | Yamada et al. |
| 2010/0157305 A1 | 6/2010 | Henderson |
| 2010/0188081 A1 | 7/2010 | Lammegger |
| 2010/0237149 A1 | 9/2010 | Olmstead |
| 2010/0271016 A1 | 10/2010 | Barclay et al. |
| 2010/0277121 A1 | 11/2010 | Hall et al. |
| 2010/0308813 A1 | 12/2010 | Lukin et al. |
| 2010/0315079 A1* | 12/2010 | Lukin .................. G01R 33/032 324/244.1 |
| 2010/0326042 A1 | 12/2010 | McLean et al. |
| 2011/0034393 A1 | 2/2011 | Justen et al. |
| 2011/0059704 A1 | 3/2011 | Norimatsu et al. |
| 2011/0062957 A1 | 3/2011 | Fu et al. |
| 2011/0063957 A1 | 3/2011 | Isshiki et al. |
| 2011/0066379 A1 | 3/2011 | Mes |
| 2011/0120890 A1 | 5/2011 | MacPherson et al. |
| 2011/0127999 A1 | 6/2011 | Lott et al. |
| 2011/0165862 A1 | 7/2011 | Yu et al. |
| 2011/0176563 A1 | 7/2011 | Friel et al. |
| 2011/0243267 A1 | 10/2011 | Won et al. |
| 2011/0270078 A1 | 11/2011 | Wagenaar et al. |
| 2012/0016538 A1* | 1/2012 | Waite .................... G01C 21/20 701/3 |
| 2012/0019242 A1 | 1/2012 | Hollenberg et al. |
| 2012/0037803 A1 | 2/2012 | Strickland |
| 2012/0044014 A1 | 2/2012 | Stratakos et al. |
| 2012/0051996 A1 | 3/2012 | Scarsbrook et al. |
| 2012/0063505 A1 | 3/2012 | Okamura et al. |
| 2012/0087449 A1 | 4/2012 | Ling et al. |
| 2012/0089299 A1 | 4/2012 | Breed |
| 2012/0140219 A1 | 6/2012 | Cleary |
| 2012/0181020 A1 | 7/2012 | Barron et al. |
| 2012/0194068 A1 | 8/2012 | Cheng et al. |
| 2012/0203086 A1 | 8/2012 | Rorabaugh et al. |
| 2012/0232838 A1* | 9/2012 | Kemppi ................. G01C 17/28 702/150 |
| 2012/0235633 A1 | 9/2012 | Kesler et al. |
| 2012/0235634 A1 | 9/2012 | Hall et al. |
| 2012/0245885 A1* | 9/2012 | Kimishima ........... G01S 5/0263 702/138 |
| 2012/0257683 A1 | 10/2012 | Schwager et al. |
| 2012/0281843 A1 | 11/2012 | Christensen et al. |
| 2012/0326793 A1 | 12/2012 | Gan |
| 2013/0043863 A1 | 2/2013 | Ausserlechner et al. |
| 2013/0093424 A1 | 4/2013 | Blank et al. |
| 2013/0127518 A1 | 5/2013 | Nakao |
| 2013/0179074 A1* | 7/2013 | Haverinen ............. G01C 21/08 701/525 |
| 2013/0215712 A1 | 8/2013 | Geiser et al. |
| 2013/0223805 A1 | 8/2013 | Ouyang et al. |
| 2013/0265782 A1 | 10/2013 | Barrena et al. |
| 2013/0270991 A1 | 10/2013 | Twitchen et al. |
| 2013/0279319 A1 | 10/2013 | Matozaki et al. |
| 2014/0012505 A1 | 1/2014 | Smith et al. |
| 2014/0037932 A1 | 2/2014 | Twitchen et al. |
| 2014/0044208 A1 | 2/2014 | Woodsum |
| 2014/0061510 A1 | 3/2014 | Twitchen et al. |
| 2014/0070622 A1 | 3/2014 | Keeling et al. |
| 2014/0072008 A1 | 3/2014 | Faraon et al. |
| 2014/0077231 A1 | 3/2014 | Twitchen et al. |
| 2014/0081592 A1 | 3/2014 | Bellusci et al. |
| 2014/0104008 A1 | 4/2014 | Gan |
| 2014/0126334 A1 | 5/2014 | Megdal et al. |
| 2014/0139322 A1 | 5/2014 | Wang et al. |
| 2014/0154792 A1 | 6/2014 | Moynihan et al. |
| 2014/0159652 A1 | 6/2014 | Hall et al. |
| 2014/0166904 A1 | 6/2014 | Walsworth et al. |
| 2014/0167759 A1 | 6/2014 | Pines et al. |
| 2014/0168174 A1 | 6/2014 | Idzik et al. |
| 2014/0180627 A1 | 6/2014 | Naguib et al. |
| 2014/0191139 A1 | 7/2014 | Englund |
| 2014/0191752 A1 | 7/2014 | Walsworth et al. |
| 2014/0198463 A1 | 7/2014 | Klein |
| 2014/0210473 A1 | 7/2014 | Campbell et al. |
| 2014/0215985 A1 | 8/2014 | Pollklas |
| 2014/0247094 A1 | 9/2014 | Englund et al. |
| 2014/0265555 A1 | 9/2014 | Hall et al. |
| 2014/0272119 A1 | 9/2014 | Kushalappa et al. |
| 2014/0273826 A1 | 9/2014 | Want et al. |
| 2014/0291490 A1 | 10/2014 | Hanson et al. |
| 2014/0297067 A1 | 10/2014 | Malay |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009746 A1 | 1/2015 | Kucsko et al. |
| 2015/0018018 A1 | 1/2015 | Shen et al. |
| 2015/0022404 A1 | 1/2015 | Chen et al. |
| 2015/0048822 A1 | 2/2015 | Walsworth et al. |
| 2015/0054355 A1 | 2/2015 | Ben-Shalom et al. |
| 2015/0061590 A1 | 3/2015 | Widmer et al. |
| 2015/0090033 A1 | 4/2015 | Budker et al. |
| 2015/0128431 A1 | 5/2015 | Kuo |
| 2015/0137793 A1 | 5/2015 | Englund et al. |
| 2015/0153151 A1* | 6/2015 | Kochanski ............. G01B 7/004 702/150 |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0253355 A1 | 9/2015 | Grinolds et al. |
| 2015/0268373 A1 | 9/2015 | Meyer |
| 2015/0269957 A1 | 9/2015 | El Hallak et al. |
| 2015/0276897 A1 | 10/2015 | Leussler et al. |
| 2015/0299894 A1 | 10/2015 | Markham et al. |
| 2015/0303333 A1 | 10/2015 | Yu et al. |
| 2015/0314870 A1 | 11/2015 | Davies |
| 2015/0326030 A1 | 11/2015 | Malpas et al. |
| 2015/0326410 A1 | 11/2015 | Krause et al. |
| 2015/0374250 A1 | 12/2015 | Hatano et al. |
| 2015/0377865 A1 | 12/2015 | Acosta et al. |
| 2015/0377987 A1 | 12/2015 | Menon et al. |
| 2016/0031339 A1* | 2/2016 | Geo ................... B60L 11/1816 320/109 |
| 2016/0036529 A1 | 2/2016 | Griffith et al. |
| 2016/0071532 A9 | 3/2016 | Heidmann |
| 2016/0077167 A1 | 3/2016 | Heidmann |
| 2016/0097702 A1 | 4/2016 | Zhao et al. |
| 2016/0139048 A1 | 5/2016 | Heidmann |

(56) References Cited

U.S. PATENT DOCUMENTS

| | | |
|---|---|---|
| 2016/0146904 A1 | 5/2016 | Stetson et al. |
| 2016/0161429 A1 | 6/2016 | Englund et al. |
| 2016/0214714 A1 | 7/2016 | Sekelsky |
| 2016/0216304 A1 | 7/2016 | Sekelsky |
| 2016/0216340 A1 | 7/2016 | Egan et al. |
| 2016/0216341 A1 | 7/2016 | Boesch et al. |
| 2016/0221441 A1 | 8/2016 | Hall et al. |
| 2016/0223621 A1 | 8/2016 | Kaup et al. |
| 2016/0231394 A1 | 8/2016 | Manickam et al. |
| 2016/0266220 A1 | 9/2016 | Sushkov et al. |
| 2016/0291191 A1 | 10/2016 | Fukushima et al. |
| 2016/0313408 A1 | 10/2016 | Hatano et al. |
| 2016/0348277 A1 | 12/2016 | Markham et al. |
| 2016/0356863 A1 | 12/2016 | Boesch et al. |
| 2017/0010214 A1 | 1/2017 | Osawa et al. |
| 2017/0010334 A1 | 1/2017 | Krause et al. |
| 2017/0010338 A1 | 1/2017 | Bayat et al. |
| 2017/0010594 A1 | 1/2017 | Kottapalli et al. |
| 2017/0023487 A1 | 1/2017 | Boesch |
| 2017/0068012 A1 | 3/2017 | Fisk |
| 2017/0104426 A1 | 4/2017 | Mills |
| 2017/0199156 A1 | 7/2017 | Villani et al. |
| 2017/0205526 A1 | 7/2017 | Meyer |
| 2017/0207823 A1 | 7/2017 | Russo et al. |
| 2017/0211947 A1 | 7/2017 | Fisk |
| 2017/0212046 A1 | 7/2017 | Cammerata |
| 2017/0212177 A1 | 7/2017 | Coar et al. |
| 2017/0212178 A1 | 7/2017 | Hahn et al. |
| 2017/0212179 A1 | 7/2017 | Hahn et al. |
| 2017/0212180 A1 | 7/2017 | Hahn et al. |
| 2017/0212181 A1 | 7/2017 | Coar et al. |
| 2017/0212182 A1 | 7/2017 | Hahn et al. |
| 2017/0212183 A1 | 7/2017 | Egan et al. |
| 2017/0212184 A1 | 7/2017 | Coar et al. |
| 2017/0212185 A1 | 7/2017 | Hahn et al. |
| 2017/0212186 A1 | 7/2017 | Hahn et al. |
| 2017/0212187 A1 | 7/2017 | Hahn et al. |
| 2017/0212190 A1 | 7/2017 | Reynolds et al. |
| 2017/0212258 A1 | 7/2017 | Fisk |

FOREIGN PATENT DOCUMENTS

| | | |
|---|---|---|
| DE | 19600241 C2 | 8/2002 |
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |
| EP | 2 745 360 | 6/2014 |
| EP | 2 769 417 | 8/2014 |
| EP | 2 790 031 | 10/2014 |
| EP | 2 837 930 | 2/2015 |
| EP | 2 907 792 | 8/2015 |
| GB | 2 433 737 | 7/2007 |
| GB | 2423366 A | 8/2008 |
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2011/046403 A2 | 4/2011 |
| WO | WO-2011/153339 | 12/2011 |
| WO | WO-2012/016977 A2 | 2/2012 |
| WO | WO-2012/084750 | 6/2012 |
| WO | WO-2013/059404 A1 | 4/2013 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2013/190329 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |
| WO | WO-2014/166883 A1 | 10/2014 |
| WO | WO-2014/210486 A1 | 12/2014 |
| WO | WO-2015/015172 A1 | 2/2015 |
| WO | WO-2015/142945 | 9/2015 |
| WO | WO-2015/157110 | 10/2015 |
| WO | WO-2015/157290 | 10/2015 |
| WO | WO-2015/158383 A1 | 10/2015 |
| WO | WO-2015/193156 A1 | 12/2015 |
| WO | WO-2016/075226 A1 | 5/2016 |
| WO | WO-2016/118756 | 7/2016 |
| WO | WO-2016/118791 | 7/2016 |
| WO | WO-2016/122965 | 8/2016 |
| WO | WO-2016/122966 | 8/2016 |
| WO | WO-2016/126435 | 8/2016 |
| WO | WO-2016/126436 | 8/2016 |
| WO | WO-2016/190909 | 12/2016 |
| WO | WO-2017/007513 | 1/2017 |
| WO | WO-2017/007514 | 1/2017 |
| WO | WO-2017/014807 | 1/2017 |
| WO | WO-2017/039747 | 3/2017 |
| WO | WO-2017/095454 A1 | 6/2017 |
| WO | WO-2017/127079 A1 | 7/2017 |
| WO | WO-2017/127080 A1 | 7/2017 |
| WO | WO-2017/127081 A1 | 7/2017 |
| WO | WO-2017/127085 A1 | 7/2017 |
| WO | WO-2017/127090 A1 | 7/2017 |
| WO | WO-2017/127091 A1 | 7/2017 |
| WO | WO-2017/127093 A1 | 7/2017 |
| WO | WO-2017/127094 A1 | 7/2017 |
| WO | WO-2017/127095 A1 | 7/2017 |
| WO | WO-2017/127096 A1 | 7/2017 |
| WO | WO-2017/127097 A1 | 7/2017 |
| WO | WO-2017/127098 A1 | 7/2017 |

OTHER PUBLICATIONS

U.S. Appl. No. 14/676,740, filed Apr. 1, 2015.
U.S. Appl. No. 15/003,678, filed Jan. 21, 2016.
U.S. Appl. No. 14/680,877, filed Apr. 7, 2015.
U.S. Appl. No. 15/003,281, filed Jan. 21, 2016.
U.S. Appl. No. 15/003,292, filed Jan. 21, 2016.
U.S. Appl. No. 15/003,298, filed Jan. 21, 2016.
U.S. Appl. No. 15/003,309, filed Jan. 21, 2016.
U.S. Appl. No. 15/003,176, filed Jan. 21, 2016.

(56) References Cited

OTHER PUBLICATIONS

U.S. Appl. No. 15/003,145, filed Jan. 21, 2016.
U.S. Appl. No. 15/003,336, filed Jan. 21, 2016.
U.S. Appl. No. 15/003,558, filed Jan. 21, 2016.
U.S. Appl. No. 15/003,519, filed Jan. 21, 2016.
U.S. Appl. No. 15/003,677, filed Jan. 21, 2016.
U.S. Appl. No. 15/003,256, filed Jan. 21, 2016.
U.S. Appl. No. 15/003,577, filed Jan. 21, 2016.
U.S. Appl. No. 15/003,704, filed Jan. 21, 2016.
U.S. Appl. No. 15/003,718, filed Jan. 21, 2016.
U.S. Appl. No. 15/003,062, filed Jan. 21, 2016.
U.S. Appl. No. 15/003,652, filed Jan. 21, 2016.
U.S. Appl. No. 15/003,634, filed Jan. 21, 2016.
U.S. Appl. No. 15/003,670, filed Jan. 21, 2016.
U.S. Appl. No. 15/003,088, filed Jan. 21, 2016.
U.S. Appl. No. 15/003,797, filed Jan. 21, 2016.
U.S. Appl. No. 15/003,590, filed Jan. 21, 2016.
U.S. Appl. No. 15/003,206, filed Jan. 21, 2016.
U.S. Appl. No. 15/003,193, filed Jan. 21, 2016.
U.S. Appl. No. 15/003,617, filed Jan. 21, 2016.
U.S. Appl. No. 15/003,396, filed Jan. 21, 2016.
U.S. Appl. No. 15/003,177, filed Jan. 21, 2016.
U.S. Appl. No. 15/003,209, filed Jan. 21, 2016.
U.S. Appl. No. 15/179,957, filed Jun. 10, 2016.
U.S. Appl. No. 15/207,457, filed Jul. 11, 2016.
U.S. Appl. No. 15/218,821, filed Jul. 25, 2016.
U.S. Appl. No. 15/204,675, filed Jul. 7, 2016.
U.S. Appl. No. 15/350,303, filed Nov. 14, 2016.
U.S. Appl. No. 15/351,862, filed Jul. 7, 2016.
U.S. Appl. No. 15/372,201, filed Dec. 7, 2016.
U.S. Appl. No. 15/376,244, filed Dec. 12, 2016.
U.S. Appl. No. 15/380,691, filed Dec. 15, 2016.
U.S. Appl. No. 15/382,045, filed Dec. 16, 2016.
U.S. Appl. No. 15/380,419, filed Dec. 15, 2016.
U.S. Appl. No. 15/419,832, filed Jan. 30, 2017.
U.S. Appl. No. 15/400,794, filed Jan. 6, 2017.
U.S. Appl. No. 15/443,422, filed Jan. 27, 2017.
U.S. Appl. No. 15/440,194, filed Feb. 23, 2017.
U.S. Appl. No. 15/437,222, filed Feb. 20, 2017.
U.S. Appl. No. 15/437,038, filed Feb. 20, 2017.
International Search Report and Written Opinion of the International Searching Authority in PCT/US2016/014390 dated Feb. 15, 2017.
Notice of Allowance dated Dec. 13, 2016, from related U.S. Appl. No. 14/680,877.
Notice of Allowance dated Dec. 22, 2016, from related U.S. Appl. No. 14/659,498.
U.S. Notice of Allowance dated Feb. 14, 2017, from related U.S. Appl. No. 15/003,677, 8 pages.
U.S. Office Action dated Feb. 10, 2017, from related U.S. Appl. No. 14/676,740, 38 pages.
U.S. Office Action dated Feb. 10, 2017, from related U.S. Appl. No. 15/003,088, 32 pages.
U.S. Office Action dated Feb. 16, 2017, from related U.S. Appl. No. 15/204,675, 15 pages.
"'Diamond Sensors, Detectors, and Quantum Devices' in Patent Application Approval Process," Chemicals & Chemistry (Feb. 28, 2014).
"Findings from University of Stuttgart in physics reported," Physics Week (Jul. 7, 2009).
"New Findings on Nitrogen from Ecole Normale Superieure Summarized (Magnetic imaging with an ensemble of nitrogen vacancy-centers in diamond)," Physics Week (Jul. 21, 2015).
"Patent Issued for Diamond Sensors, Detectors, and Quantum Devices (U.S. Pat. No. 9,249,526)," Journal of Engineering (Feb. 15, 2016).
"Researchers Submit Patent Application, 'Diamond Sensors, Detectors, and Quantum Devices', for Approval," Chemicals & Chemistry (Apr. 11, 2014).
Acosta, "Optical Magnetometry with Nitrogen-Vacancy Centers in Diamond," University of California Berkeley, 2011.
Acosta, et al., "Diamonds with a high density of nitrogen-vacancy centers for magnetometry applications," Physical Review B, Sep. 2009.
Acosta, et al., "Nitrogen-vacancy centers: physics and applications," MRS Bulletin, 2013.
Aiello, et al., "Composite-pulse magnetometry with a solid-state quantum sensor," Nature Communications, Jan. 2013.
Alam, "Solid-state C-13 magic angle spinning NMR spectroscopy characterization of particle size structural variations in synthetic nanodiamonds," Materials Chemistry and Physics, Jun. 2004.
Albrecht, et al., "Coupling of nitrogen vacancy centres in nanodiamonds by means of phonons," New Journal of Physics, Aug. 2013.
Anthony, et al., "Jahn-Teller Splitting and Zeeman Effect of Acceptors in Diamond," 20th International Conference on Defects in Semiconductors, Jul. 1999.
Appel, et al., "Nanoscale microwave imaging with a single electron spin in diamond," New Journal of Physics, Nov. 2015.
Arai, et al., "Fourier magnetic imaging with nanoscale resolution and compressed sensing speed-up using electronic spins in diamond," Nature Nanotechnology, Oct. 2015.
Aslam, et al., "Single spin optically detected magnetic resonance with 60-90 GHz (E-band) microwave resonators," Review of Scientific Instruments, Jun. 2015.
Awschalom, et al., "Diamond age of spintronics," Scientific American, Oct. 2007.
Babamoradi, et al., "Correlation between entanglement and spin density in nitrogen-vacancy center of diamond," European Physical Journal D, Dec. 2011.
Babunts, et al., "Diagnostics of NV defect structure orientation in diamond using optically detected magnetic resonance with a modulated magnetic field," Technical Physics Letters, Jun. 2015.
Babunts, et al., "Temperature-scanned magnetic resonance and the evidence of two-way transfer of a nitrogen nuclear spin hyperfine interaction in coupled NV-N pairs in diamond," JETP Letters, Jun. 2012.
Bagguley, et al., "Zeeman effect of acceptor states in semiconducting diamond," Journal of the Physical Society of Japan, 1966.
Balasubramanian, et al., "Nanoscale imaging magnetometry with diamond spins under ambient conditions," Nature, Oct. 2008.
Balmer, et al., "Chemical Vapour deposition synthetic diamond: materials technology and applications," J. of Physics, 2009.
Baranov, et al., "Enormously High Concentrations of Fluorescent Nitrogen-Vacancy Centers Fabricated by Sintering of Detonation Nanodiamonds," Small, Jun. 2011.
Barfuss, et al., "Strong mechanical driving of a single electron spin," Nature Physics, Oct. 2015.
Bennett, et al., "CVD Diamond for High Power Laser Applications," Proceedings of SPIE, Jan. 2013.
Berman & Chernobrod, "Single-spin microscope with sub-nanoscale resolution based on optically detected magnetic resonance," Proceedings of SPIE, May 2010.
Berman, et al. "Measurement of single electron and nuclear spin states based on optically detected magnetic resonance," J. Physics: Conf. Series 38: 167-170 (2006).
Blakley, et al., "Room-temperature magnetic gradiometry with fiber-coupled nitrogen-vacancy centers in diamond," Optics Letters, Aug. 2015.
Bourgeois, et al., "Photoelectric detection of electron spin resonance of nitrogen-vacancy centres in diamond," Nature Communications, Oct. 2015.
Budker & Kimball, "Optical Magnetometry," Cambridge Press, 2013.
Budker & Romalis, "Optical Magnetometry," Nature Physics, 2007.
Casanova, et al., "Effect of magnetic field on phosphorus centre in diamond," Physica Status Solidi A, Jul. 2001.
Castelletto, et al., "Frontiers in diffraction unlimited optical methods for spin manipulation, magnetic field sensing and imaging using diamond nitrogen vacancy defects," Nanophotonics, 2012.

(56) References Cited

OTHER PUBLICATIONS

Chapman, et al., "Anomalous saturation effects due to optical spin depolarization in nitrogen-vacancy centers in diamond nanocrystals," Physical Review B, Jul. 2012.
Chen, et al., "Vector magnetic field sensing by a single nitrogen vacancy center in diamond," EPL, Mar. 2013.
Chernobrod, et al., "Improving the sensitivity of frequency modulation spectroscopy using nanomechanical cantilevers," Applied Physics Letters, 2004.
Chernobrod, et al., "Spin Microscope Based on Optically Detected Magnetic Resonance," Journal of Applied Physics, 2005.
Childress, et al., "Coherent dynamics of coupled electron and nuclear spin qubits in diamond," Science, 2006.
Chipaux, et al., "Magnetic imaging with an ensemble of nitrogen vacancy-centers in diamond," European Physical Journal D, Jul. 2015.
Chipaux, et al., "Nitrogen vacancies (NV) centers in diamond for magnetic sensors and quantum sensing," Proceedings of SPIE, Jan. 2015.
Chipaux, et al., "Wide bandwidth instantaneous radio frequency spectrum analyzer based on nitrogen vacancy centers in diamond," Applied Physics Letters, Dec. 2015.
Clevenson, et al., "Broadband magnetometry and temperature sensing with a light-trapping diamond waveguide," Nature Physics, May 2015.
Cooper, et al., " Time-resolved magnetic sensing with electronic spins in diamond," Nature Communications, Jan. 2014.
Creedon, et al., "Strong coupling between P1 diamond impurity centers and a three-dimensional lumped photonic microwave cavity," Physical Review B, Apr. 2015.
Davies, "Current problems in diamond: towards a quantitative understanding," Physica B—Condensed Matter, Dec. 1999.
De Lange, et al., "Single-Spin Magnetometry with Multipulse Sensing Sequences," Physical Review Letters, Feb. 2011.
Degen, "Scanning magnetic field microscope with a diamond single-spin sensor ," Applied Physics Letters, 2008.
Delacroix, et al., "Design, manufacturing, and performance analysis of mid-infrared achromatic half-wave plates with diamond subwavelength gratings," Applied Optics, 2012.
Denatale, et al., "Fabrication and characterization of diamond moth eye antireflective surfaces on Ge," J. of Applied Physics, 1982.
Dobrovitski, et al., "Quantum Control over Single Spins in Diamond," Annual Review of Condensed Matter Physics vol. 4, 2013.
Doherty, et al., "The nitrogen-vacancy colour centre in diamond," Physics Reports, Jul. 2013.
Doherty, et al., "Theory of the ground-state spin of the NV-center in diamond," Physical Review B, May 2012.
Doi, et al., "Pure negatively charged state of the NV center in n-type diamond," Physical Review B, Feb. 2016.
Drake, et al., "Influence of magnetic field alignment and defect concentration on nitrogen-vacancy polarization in diamond," New Journal of Physics, Jan. 2016.
Dreau, et al., "Avoiding power broadening in optically detected magnetic resonance of single NV defects for enhanced dc magnetic field sensitivity," Physical Review B, Nov. 2011.
Dreau, et al., "High-resolution spectroscopy of single NV defects coupled with nearby C-13 nuclear spins in diamond," Physical Review B, Apr. 2012.
Dumeige, et al., "Magnetometry with nitrogen-vacancy ensembles in diamond based on infrared absorption in a doubly resonant optical cavity," Physical Review B, Apr. 2013.
Epstein, et al., "Anisotropic interactions of a single spin and dark-spin spectroscopy on diamond," Center for Spintronics and Quantum Computation, 2005.
Fedotov, et al., "High-resolution magnetic field imaging with a nitrogen-vacancy diamond sensor integrated with a photonic-crystal fiber," Optics Letters, Feb. 2016.
Fedotov, et al., "Photonic-crystal-fiber-coupled photoluminescence interrogation of nitrogen vacancies in diamond nanoparticles," Laser Physics Letters, Feb. 2012.
Feng & Wei, "A steady-state spectral method to fit microwave absorptions of NV centers in diamonds: application to sensitive magnetic field sensing," Measurement Science & Technology, Oct. 2014.
Freitas, et al., "Solid-State Nuclear Magnetic Resonance (NMR) Methods Applied to the Study of Carbon Materials," Chemistry and Physics of Carbon, vol. 31, 2012.
Geiselmann, et al., "Fast optical modulation of the fluorescence from a single nitrogen-vacancy centre," Nature Physics, Dec. 2013.
Gombert & Blasi, "The Moth-Eye Effect—From Fundamentals to Commercial Exploitation," Functional Properties of Bio-Inspired Surfaces, Nov. 2009.
Gong, et al., "Generation of Nitrogen-Vacancy Center Pairs in Bulk Diamond by Molecular Nitrogen Implantation," Chinese Physics Letters, Feb. 2016.
Gould, et al., "An imaging magnetometer for bio-sensing based on nitrogen-vacancy centers in diamond," Proceedings of the SPIE—Progress in Biomedical Optics and Imaging, 2014.
Gould, et al., "Room-temperature detection of a single 19 nm super-paramagnetic nanoparticle with an imaging magnetometer," Applied Physics Letters, Aug. 2014.
Gruber, et al., "Scanning confocal optical microscopy and magnetic resonance on single defect centers," Science, Jun. 1997.
Haeberle, et al., "Nanoscale nuclear magnetic imaging with chemical contrast," Nature Nanotechnology, Feb. 2015.
Haihua, et al., "Design of wideband anti-reflective sub wavelength nanostructures," Infrared and Laser Engineering, 2011.
Hall, et al., "Sensing of Fluctuating Nanoscale Magnetic Fields Using Nitrogen-Vacancy Centers in Diamond," Physical Review Letters, Nov. 2009.
Hanson, et al., "Coherent Dynamics of a single spin interacting with an adjustable spin bath," Sci. Am. Ass'n for the Advancement of Science, 2008.
Hanson, et al., "Polarization and Readout of Coupled Single Spins in Diamond," Physical Review Letters, 2006.
Hanson, et al., "Room-temperature manipulation and decoherence of a single spin in diamond," Physical Review, 2006.
Hanzawa, et al., "Zeeman effect on the zero-phonon line of the NV center in synthetic diamond," Physica B, Feb. 1993.
Hegyi & Yablonovitch, "Molecular imaging by optically detected electron spin resonance of nitrogen-vacancies in nanodiamonds," Nano Letters, Mar. 2013.
Hegyi & Yablonovitch, "Nanodiamond molecular imaging with enhanced contrast and expanded field of view," Journal of Biomedical Optics, Jan. 2014.
Hilser, et al., "All-optical control of the spin state in the NV-center in diamond," Physical Review B, Sep. 2012.
Hobbs, "Study of the Environmental and Optical Durability of AR Microstructures in Sapphire, ALON, and Diamond," Proceedings of SPIE, 2009.
Huebener, et al., "ODMR of NV centers in nano-diamonds covered with N@C60," Physica Status Solidi B, Oct. 2008.
Huxter, et al., "Vibrational and electronic dynamics of nitrogen-vacancy centres in diamond revealed by two-dimensional ultrafast spectroscopy," Nature Physics, Nov. 2013.
Ivady, et al., "Pressure and temperature dependence of the zero-field splitting in the ground state of NV centers in diamond: A first-principles study," Physical Review B, Dec. 2014.
Jarmola, et al., "Temperature- and Magnetic-Field-Dependent Longitudinal Spin Relaxation in Nitrogen-Vacancy Ensembles in Diamond," Physical Review Letters, May 2012.
Jensen, et al., "Light narrowing of magnetic resonances in ensembles of nitrogen-vacancy centers in diamond," Physical Review, Jan. 2013.
Kailath, "Linear Systems," Prentice Hall, 1979.
Karlsson, et al., "Diamond micro-optics: microlenses and antireflection structures surfaces for the infrared spectral region," Optics Express, 2003.
Khan & Hemmer, "Noise limitation in nano-scale imaging," Proceedings of SPIE, Dec. 2005.
Kim, et al., "Electron spin resonance shift and linewidth broadening of nitrogen-vacancy centers in diamond as a function of electron irradiation dose," Applied Physics Letters, Aug. 2012.

(56) References Cited

OTHER PUBLICATIONS

Kim, et al., "Magnetospectroscopy of acceptors in 'blue' diamonds," Physica B, Aug. 2001.
Kim, et al., "Zeeman effect of electronic Raman lines of accepters in elemental semiconductors: Boron in blue diamond," Physical Review B, Sep. 2000.
King, et al., "Optical polarization of 13C nuclei in diamond through nitrogen vacancy centers," Physical Review B, Feb. 2010.
Kok, et al., "Materials Science: Qubits in the pink," Nature, 2006.
Konenko, et al., "Formation of antireflective surface structures on diamond films by laser patterning," Applied Physics A, 1999.
Kraus, et al., "Magnetic field and temperature sensing with atomic-scale spin defects in silicon carbide," Scientific Reports, Jul. 2014.
Lai, et al., "Influence of a static magnetic field on the photoluminescence of an ensemble of nitrogen-vacancy color centers in a diamond single-crystal," Applied Physics Letters, Sep. 2009.
Lai, et al., "Optically detected magnetic resonance of a single Nitrogen-Vacancy electronic spin in diamond nanocrystals," CLEO/EQEC, 2009.
Laraoui, et al., "Nitrogen-vacancy-assisted magnetometry of paramagnetic centers in an individual diamond nanocrystal," Nano Letters, Jul. 2012.
Lazariev, et al., "A nitrogen-vacancy spin based molecular structure microscope using multiplexed projection reconstruction," Scientific Reports, Sep. 2015.
Lee, et al., "Vector magnetometry based on S=3/2 electronic spins," Physical Review B, Sep. 2015.
Lesik, et al., "Preferential orientation of NV defects in CVD diamond films grown on (113)-oriented substrates," Diamond and Related Materials, Jun. 2015.
Levchenko, et al., "Inhomogeneous broadening of optically detected magnetic resonance of the ensembles of nitrogen-vacancy centers in diamond by interstitial carbon atoms," Applied Physics Letters, Mar. 2015.
Liu, et al., "Electron spin studies of nitrogen vacancy centers in nanodiamonds," Acta Physica Sinica, Aug. 2013.
Liu, et al., "Fiber-integrated diamond-based magnetometer," Applied Physics Letters, Sep. 2013.
MacLaurin, et al., "Nanoscale magnetometry through quantum control of nitrogen-vacancy centres in rotationally diffusing nanodiamonds," New Journal of Physics, Jan. 2013.
Macs, et al., "Diamond as a magnetic field calibration probe," Journal of Physics D: Applied Physics, Apr. 2004.
Maletinsky, et al., "A robust scanning diamond sensor for nanoscale imaging with single nitrogen-vacancy centres," Nature Nanotechnology, May 2012.
Mamin, et al., "Multipulse Double-Quantum Magnetometry with Near-Surface Nitrogen-Vacancy Centers," Physical Review Letters, Jul. 2014.
Mamin, et al., "Nanoscale Nuclear Magnetic Resonance with a Nitrogen-Vacancy Spin Sensor," Science, Feb. 2013.
Manson, et al., "GR transitions in diamond: magnetic field measurements," Journal of Physics C, Nov. 1980.
Massachusetts Institute of Technology; "Wide-Field Imaging Using Nitrogen Vacancies" in Patent Application Approval Process, Physics Week (2015).
Matsuda, et al., "Development of a plastic diamond anvil cell for high pressure magneto-photoluminescence in pulsed high magnetic fields," International Journal of Modern Physics B, Nov. 2004.
Maze et al., "Nanoscale magnetic sensing with an individual electronic spin in diamond," Nature Physics (2008).
Maze, et al., "Nanoscale magnetic sensing using spin qubits in diamond," Nature Physics, 2009.
Meijer, et al., "Generation of single color centers by focused nitrogen implantation," Applied Physics Letters, Dec. 2005.
Millot, et al., "High-field Zeeman and paschen-back effects at high pressure in oriented ruby," Physical Review B, Oct. 2008.
Moriyama, et al., "Importance of electron-electron interactions and Zeeman splitting in single-wall carbon nanotube quantum dots," Physica E, Feb. 2005.
Mrozek, et al., "Circularly polarized microwaves for magnetic resonance study in the GHz range: Application to nitrogen-vacancy in diamonds," Applied Physics Letters, Jul. 2015.
Nagl, et al., "Improving surface and defect center chemistry of fluorescent nanodiamonds for imaging purposes—a review," Analytical and Bioanalaytical Chemistry, Oct. 2015.
Neumann, et al., "Excited-state spectroscopy of single NV defects in diamond using optically detected magnetic resonance," New Journal of Physics, Jan. 2009.
Nizovtsev & Kilin, "Optically Detected Magnetic Resonance Spectra of the 14NV-13C Spin Systems in Diamond: Analytical Theory and Experiment," Doklady of the National Academy of Sciences of Belarus, 2013.
Nizovtsev, et al., "Modeling fluorescence of single nitrogen-vacancy defect centers in diamond," Physica B—Condensed Matter, Dec. 2001.
Nizovtsev, et al., "Theoretical study of hyperfine interactions and optically detected magnetic resonance spectra by simulation of the C-291(NV)H—(172) diamond cluster hosting nitrogen-vacancy center," New Journal of Physics, Aug. 2014.
Nowodzinski, et al., "Nitrogen-Vacancy centers in diamond for current imaging at the redistributive layer level of Integrated Circuits," Microelectronics Reliability, Aug. 2015.
Nusran, et al., "Optimizing phase-estimation algorithms for diamond spin magnetometry," Physical Review B, Jul. 2014.
Ohashi, et al., "Negatively Charged Nitrogen-Vacancy Centers in a 5 nm Thin C-12 Diamond Film," Nano Letters, Oct. 2013.
Plakhotnik, et al., "Super-Paramagnetic Particles Chemically Bound to Luminescent Diamond : Single Nanocrystals Probed with Optically Detected Magnetic Resonance," Journal of Physical Chemistry C, Aug. 2015.
Rabeau, et al., "Implantation of labelled single nitrogen vacancy centers in diamond using N-15," Applied Physics Letters, Jan. 2006.
Ranjbar, et al., "Many-electron states of nitrogen-vacancy centers in diamond and spin density calculations," Physical Review B, Oct. 2011.
Reynhardt, "Spin-lattice relaxation of spin-1/2 nuclei in solids containing diluted paramagnetic impurity centers. I. Zeeman polarization of nuclear spin system," Concepts in Magnetic Resonance Part A, Sep. 2003.
Rogers, et al., "Singlet levels of the NV(-)centre in diamond," New Journal of Physics, Jan. 2015.
Rondin, et al., "Magnetometry with nitrogen-vacancy defects in diamond," Reports on Progress in Physics, May 2014.
Rondin, et al., "Nanoscale magnetic field mapping with a single spin scanning probe magnetometer," Applied Physics Letters, Apr. 2012.
Sarkar, et al., "Magnetic properties of graphite oxide and reduced graphene oxide," Physica E, 2014.
Scheuer, et al., "Accelerated 2D magnetic resonance spectroscopy of single spins using matrix completion," Scientific Reports, Dec. 2015.
Schirhagl, et al., "Nitrogen-vacancy centers in diamond: Nanoscale sensors for physics and biology," Annual Review of Physical Chemistry, Jan. 2014.
Schoenfeld & Harneit, "Real time magnetic field sensing and imaging using a single spin in diamond," Physical Review Letters, Jan. 2011.
Sedov, et al., "Si-doped nano- and microcrystalline diamond films with controlled bright photoluminescence of silicon-vacancy color centers," Diamond and Related Materials, Jun. 2015.
Shames, et al., "Magnetic resonance tracking of fluorescent nanodiamond fabrication," Journal of Physics D: Applied Physics, Apr. 2015.
Simanovskaia, et al., "Sidebands in optically detected magnetic resonance signals of nitrogen vacancy centers in diamond," Physical Review B, Jun. 2013.
Sotoma, et al., "Effective production of fluorescent nanodiamonds containing negatively-charged nitrogen-vacancy centers by ion irradiation," Diamond and Related Materials, Oct. 2014.

(56) References Cited

OTHER PUBLICATIONS

Steiner, et al., "Universal enhancement of the optical readout fidelity of single electron spins at nitrogen-vacancy centers in diamond," Physical Review B, Jan. 2010.
Steinert et al., "High-sensitivity magnetic imaging using an array of spins in diamond," Rev. Sci. Inst. (2010).
Steinert, et al., "High sensitivity magnetic imaging using an array of spins in diamond," Review of Scientific Instruments, Apr. 2010.
Stepanov, et al., "High-frequency and high-field optically detected magnetic resonance of nitrogen vacancy-centers in diamond," Applied Physics Letters, Feb. 2015.
Sternschulte, et al., "Uniaxial stress and Zeeman splitting of the 1.681 eV optical center in a homoepitaxial CVD diamond film," Diamond and Related Materials, Sep. 1995.
Storteboom, et al., "Lifetime investigation of single nitrogen vacancy centres in nanodiamonds," Optics Express, May 2015.
Tahara, et al., "Quantifying selective alignment of ensemble nitrogen-vacancy centers in (111) diamond," Applied Physics Letters, Nov. 2015.
Taylor, et al., "High-sensitivity diamond magnetometer with nanoscale resolution," Nature Physics, Oct. 2008.
Terblanche, et al., "13C spin-lattice relaxation in natural diamond: Zeeman relaxation at 4.7 T and 300 K due to fixed paramagnetic nitrogen defects," Solid State Nuclear Magnetic Resonance, Aug. 2001.
Terblanche, et al., "13C spin-lattice relaxation in natural diamond: Zeeman relaxation in fields of 500 to 5000 G at 300 K due to fixed paramagnetic nitrogen defects," Solid State Nuclear Magnetic Resonance, May 2001.
Tetienne, et al., "Magnetic-field-dependent photodynamics of single NV defects in diamond: an application to qualitative all-optical magnetic imaging," New Journal of Physics, Oct. 2012.
Tong, et al., "A hybrid-system approach for W state and cluster state generation," Optics Communication 310: 166-172 (2014).
Uhlen, et al., "New Diamond Nanofabrication process for hard x-ray zone plates," J. of Vacuum Science & Tech. B, 2011.
Vershovskii & Dmitriev, "Combined excitation of an optically detected magnetic resonance in nitrogen-vacancy centers in diamond for precision measurement of the components of a magnetic field vector," Technical Physics Letters, Nov. 2015.
Vershovskii & Dmitriev, "Micro-scale three-component quantum magnetometer based on nitrogen-vacancy color centers in diamond crystal," Technical Physics Letters, Apr. 2015.
Wang, et al., "Optimizing ultrasensitive single electron magnetometer based on nitrogen-vacancy center in diamond," Chinese Science Bulletin, Aug. 2013.
Webber, et al., "Ab initio thermodynamics calculation of the relative concentration of NV- and NV0 defects in diamond," Physical Review B, Jan. 2012.
Wolf, et al., "Subpicotesla Diamond Magnetometry," Physical Review X, Oct. 2015.
Wolfe, et al., "Off-resonant manipulation of spins in diamond via precessing magnetization of a proximal ferromagnet," Physical Review B, May 2014.
Xue & Liu, "Producing GHZ state of nitrogen-vacancy centers in cavity QED," Journal of Modern Optics, Mar. 2013.
Yang & Gu, "Novel calibration techniques for high pulsed-magnetic fields using luminescence caused by photo," Journal of Huazhong University of Science and Technology, Jun. 2007.
Yavkin, et al., "Defects in Nanodiamonds: Application of High-Frequency cw and Pulse EPR, ODMR," Applied Magnetic Resonance, Oct. 2014.
Yu, et al., "Bright fluorescent nanodiamonds: no photobleaching and low cytotoxicity," J. Am. Chem. Soc., 2005.
Zhang, et al., "Laser-polarization-dependent and magnetically controlled optical bistability in diamond nitrogen-vacancy centers," Physics Letters A, Nov. 2013.
Zhang, et al., "Laser-polarization-dependent spontaneous emission of the zero phonon line from single nitrogen-vacancy center in diamond," Chinese Physics B, Apr. 2014.
Zhang, et al., "Scalable quantum information transfer between nitrogen-vacancy-center ensembles," Annals of Physics, Apr. 2015.
Zhao, et al., "Atomic-scale magnetometry of distant nuclear spin clusters via nitrogen-vacancy spin in diamond," Nature Nanotechnology, Apr. 2011.
GB Office Action dated Jan. 10, 2017, in related national stage application GB1618202.4.
Fallah et al., "Multi-sensor approach in vessel magnetic wake imaging," Wave Motion 51(1): 60-76 (Jan. 2014), retrieved from http://www.sciencedirect.com/science/article/pii/S0165212513001133 (Aug. 21, 2016), 17 pages.
International Preliminary Report on Patentability dated Oct. 20, 2016 from related PCT application PCT/US2015/024723, 7 pages.
International Search Report and Written Opinion of the International Searching Authority dated Sep. 13, 2016 from related PCT application PCT/US16/14377, 11 pages.
Notice of Allowance dated Aug. 17, 2016, from related U.S. Appl. No. 15/003,718, 8 pages.
Notice of Allowance dated Sep. 8, 2016, from related U.S. Appl. No. 15/003,298, 10 pages.
Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
U.S. Office Action dated Aug. 24, 2016 from related U.S. Appl. No. 14/676,740, 19 pages.
U.S. Office Action dated Oct. 14, 2016 from related U.S. Appl. No. 15/003,677, 13 pages.
U.S. Office Action dated Oct. 19, 2016 from related U.S. Appl. No. 15/218,821, 6 pages.
U.S. Office Action dated Nov. 2, 2016 from related U.S. Appl. No. 15/003,256, 19 pages.
U.S. Office Action dated Nov. 3, 2016 from related U.S. Appl. No. 15/204,675, 9 pages.
Widmann et al., "Coherent control of single spins in silicon carbide at room temperature," Nature Materials, 14: 164-168 (Feb. 2015) (available online Dec. 1, 2014), 5 pages.
Acosta et al., "Broadband magnetometry by infrared-absorption detection of nitrogen-vacancy ensembles in diamond," Appl. Phys. Letters 97: 174104 (Oct. 29, 2010), 4 pages.
Barry et al., "Optical magnetic detection of single-neuron action potentials using quantum defects in diamond," as submitted to Quantum Physics on Feb. 2, 2016, 23 pages.
Constable, "Geomagnetic Spectrum, Temporal." In Encyclopedia of Geomagnetism and Paleomagnetism, pp. 353-355, Springer: Dordrecht, Netherlands (2007).
International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jul. 12, 2016, from related PCT application PCT/US2016/014287, 14 pages.

(56) References Cited

OTHER PUBLICATIONS

International Search Report and Written Opinion of the International Searching Authority dated Jul. 16, 2015, from related PCT application PCT/US2015/24723, 8 pages.
International Search Report and Written Opinion of the International Searching Authority dated Jun. 10, 2016 from related PCT application PCT/US2016/014290, 11 pages.
International Search Report and Written Opinion of the International Searching Authority dated Jun. 2, 2016, from related PCT application PCT/US2016/014386, 14 pages.
International Search Report and Written Opinion of the International Searching Authority dated Jun. 2, 2016, from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016, from related PCT application PCT/US2016/014363, 8 pages.
International Search Report and Written Opinion of the International Searching Authority dated Mar. 25, 2016, from related PCT application PCT/US2016/014389, 19 pages.
International Search Report and Written Opinion of the International Searching Authority dated Mar. 28, 2016, from related PCT application PCT/US2016/014380, 9 pages.
International Search Report and Written Opinion of the International Searching Authority dated Mar. 28, 2016, from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016, from related PCT application PCT/US2016/014330, 8 pages.
International Search Report and Written Opinion of the International Searching Authority dated Mar. 29, 2016, from related PCT application PCT/US2016/014328, 7 pages.
International Search Report and Written Opinion of the International Searching Authority dated Mar. 29, 2016, from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated May 26, 2016, 2016 from related PCT application PCT/US2016/014331, 15 pages.
Le Sage et al., "Efficient photon detection from color centers in a diamond optical waveguide," Phys. Rev. B 85: 121202(R), pp. 121202-1-121202-4, (Mar. 23, 2012).

MacQuarie et al., "Mechanical spin control of nitrogen-vacancy centers in diamond," Retrieved from http://www.arxiv.org/pdf/1306.6356.pdf, pp. 1-8, (Jun. 2013).
Nobauer et al., "Smooth optimal quantum control for robust solid state spin magnetometry," Retrieved from http://www.arxiv.org/abs/1412.5051, pp. 1-12, (Dec. 2014).
Polatomic. "AN/ASQ-233A Digital Magnetic Anomaly Detecting Set." Retrieved May 9, 2016, from http://polatomic.com/images/DMAD_Data_Sheet_09-2009.pdf (2009), 1 page.
Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.
Shao et al., "Diamond Color Center Based FM Microwave Demodulator," in Conference on Lasers and Electro-Optics, OSA Technical Digest (online) (Optical Society of America), paper JTh2A.136, 2 pages. (Jun. 5-10, 2016).
U.S. Notice of Allowance dated Apr. 20, 2016, from related U.S. Appl. No. 15/003,718, 9 pages.
U.S. Notice of Allowance dated Mar. 29, 2016, from related U.S. Appl. No. 15/003,590, 11 pages.
U.S. Office Action dated Jul. 29, 2016 from related U.S. Appl. No. 14/680,877, 8 pages.
U.S. Office Action dated May 13, 2016, from related U.S. Appl. No. 14/676,740, 15 pages.
U.S. Office Action dated May 6, 2016, from related U.S. Appl. No. 14/659,498, 20 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013).
Brenneis, et al. "Ultrafast electronic readout of diamond nitrogen-vacancy centres coupled to graphene." Nature nanotechnology 10.2 (2015): 135-139.
Chavez, et al. "Detecting Arctic oil spills with NMR: a feasibility study." Near Surface Geophysics 13.4 (Feb. 2015): 409-416.
Dale, et al. "Medical applications of diamond magnetometry: commercial viability." arXiv preprint arXiv:1705.01994 (May 8, 2017), pp. 1-7.
Fologea, et al. "Detecting single stranded DNA with a solid state nanopore." Nano Letters 5.10 (Aug. 15, 2005): 1905-1909.
Gaebel, et al. "Room-temperature coherent coupling of single spins in diamond." Nature Physics 2.6 (May 28, 2006): 408-413.
Heerema, et al. "Graphene nanodevices for DNA sequencing." Nature nanotechnology 11.2 (Feb. 3, 2016): 127-136.
International Search Report and Written Opinion of the International Searching Authority dated Apr. 4, 2017 from related PCT application PCT/US16/68366, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 27, 2017 from related PCT application PCT/US16/68344, 6 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017, from related PCT application PCT/US2017/021593, 10 pages.
International Search Report and Written Opinion of the International Searching Authority dated May 19, 2017, from related PCT application PCT/US17/18099, 16 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.

(56) References Cited

OTHER PUBLICATIONS

International Search Report and Written Opinion of the International Searching Authority dated May 8, 2017 from related PCT application PCT/US2017/17321, 17 pages.
Keyser "Enhancing nanopore sensing with DNA nanotechnology." Nature nanotechnology 11.2 (Feb. 2016): 106-108.
Lindsay "The promises and challenges of solid-state sequencing." Nature nanotechnology 11.2 (Feb. 2016): 109-111.
Matlashov, et al. "SQUIDs for magnetic resonance imaging at ultra-low magnetic field." PIERS online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.
Moessle, et al. "SQUID-detected magnetic resonance imaging in microtesla fields." Annu. Rev. Biomed. Eng. 9 (May 23, 2008): 389-413.
Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.
Qiu et al., "Low-field NMR Measurement Procedure when SQUID Detection is Used," IEEE/CSC & ESAS European Superconductivity News Forum, No. 5, Jul. 2008.
Qiu, et al. "SQUID-detected NMR in Earth's magnetic field." Journal of Physics: Conference Series. vol. 97. No. 1. IOP Publishing, Mar. 2008, pp. 1-7.
Steinert et al., "Magnetic spin imaging under ambient conditions with sub-cellular resolution." Nature Comms 4:1607 (Mar. 19, 2013).
Sushkov, et al. "All-optical sensing of a single-molecule electron spin." Nano letters 14.11 (Nov. 7, 2013): 6443-6448.
Tetienne, et al. "Spin relaxometry of single nitrogen-vacancy defects in diamond nanocrystals for magnetic noise sensing." Physical Review B 87.23 (Apr. 3, 2013): 235436-1-235436-5.
U.S. Notice of Allowance dated Mar. 15, 2017, from related U.S. Appl. No. 15/351,862, 6 pages.
U.S. Notice of Allowance dated May 26, 2017 from related U.S. Appl. No. 15/218,821, 7 pages.
U.S. Office Action dated Apr. 17, 2017, from related U.S. Appl. No. 15/003,558, 12 pages.
U.S. Office Action dated Mar. 1, 2017, from related U.S. Appl. No. 15/003,634, 7 pages.
U.S. Office Action dated Mar. 16, 2017, from related U.S. Appl. No. 15/218,821, 7 pages.
Wells, et al. "Assessing graphene nanopores for sequencing DNA." Nano letters 12.8 (Jul. 10, 2012): 4117-4123.
Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.
Bucher et al, "High Resolution Magnetic Resonance Spectroscopy Using Solid-State Spins", May 25, 2017, downloaded from https://arxiv.org/ (arXiv.org > quant-ph > arXiv:1705.08887) on May 25, 2017, pp. 1-24.
International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 9, 2017, from related patent application PCT/US2017/024181, 13 pages.
International Search Report and Written Opinion of the International Searching Authority dated Jun. 9, 2017, from related PCT application PCT/US2017/024179, 9 pages.
International Search Report and Written Opinion of the International Searching Authority dated Jul. 14, 2017, from related PCT application PCT/US2017/022118, 13 pages.
International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.
International Search Report and Written Opinion of the International Searching Authority dated Jun. 15, 2017, from related PCT application PCT/US2017/024182, 21 pages.
International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169, 11 pages.
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168, 7 pages.
International Search Report and Written Opinion of the International Searching Authority dated Jun. 6, 2017, from related PCT application PCT/2017/024165, 9 pages.
International Search Report and Written Opinion of the International Searching Authority dated Jun. 6, 2017, from related PCT application PCT/US2017/024172, 9 pages.
Michaelovich et al., "Polarization Dependencies of the Nitrogen-Vacancy Center." Undergraduate Project Report, Ben-Gurion University, Aug. 2015, pp. 1-9.
Notice of Allowance dated Jun. 8, 2017, from related U.S. Appl. No. 15/351,862, 7 pages.
Sheinker et al., "Localization in 3-D Using Beacons of Low Frequency Magnetic Field." IEEE Transactions on Instrumentation and Measurement 62(12): 3194-3201 (Dec. 2013), 8 pages.
U.S. Notice of Allowance dated Aug. 11, 2017 from related U.S. Appl. No. 15/003,558, 5 pages.
U.S. Notice of Allowance dated Jul. 18, 2017 from related U.S. Appl. No. 15/003,634, 6 pages.
U.S. Notice of Allowance dated Jul. 24, 2017 from related U.S. Appl. No. 15/003,088, 12 pages.
U.S. Notice of Allowance dated Jun. 20, 2017 from related U.S. Appl. No. 15/204,675, 9 pages.
U.S. Notice of Allowance dated Jun. 28, 2017 from related U.S. Appl. No. 15/003,256, 10 pages.
U.S. Office Action dated Aug. 15, 2017 from related U.S. Appl. No. 15/003,281, 12 pages.
U.S. Office Action dated Jul. 27, 2017 from related U.S. Appl. No. 15/003,577, 15 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from related U.S. Appl. No. 15/003,678, 15 pages.
U.S. Office Action dated Jun. 2, 2017, from related U.S. Appl. No. 15/476,636, 10 pages.
Wroble, "Performance Analysis of Magnetic Indoor Local Positioning System." Western Michigan University Master's Theses, Paper 609 (Jun. 2015), 42 pages.

(56) References Cited

OTHER PUBLICATIONS

International Search Report and Written Opinion from related PCT application PCT/US2017/035315 dated Aug. 24, 2017, 7 pages.
Ramsey, et al., "Phase Shifts in the Molecular Beam Method of Separated Oscillating Fields", Physical Review, vol. 84, No. 3, Nov. 1, 1951, pp. 506-507.
U.S. Notice of Allowance on U.S. Appl. No. 14/676,740 dated Sep. 1, 2017, 7 pages.
U.S. Notice of Allowance on U.S. Appl. No. 15/003,281 dated Sep. 26, 2017, 7 pages.
U.S. Notice of Allowance on U.S. Appl. No. 15/476,636 dated Sep. 14, 2017, 10 pages.
U.S. Office Action on U.S. Appl. No. 15/003,176 dated Sep. 27, 2017, 8 pages.
U.S. Office Action on U.S. Appl. No. 15/003,292 dated Sep. 8, 2017, 8 pages.

\* cited by examiner

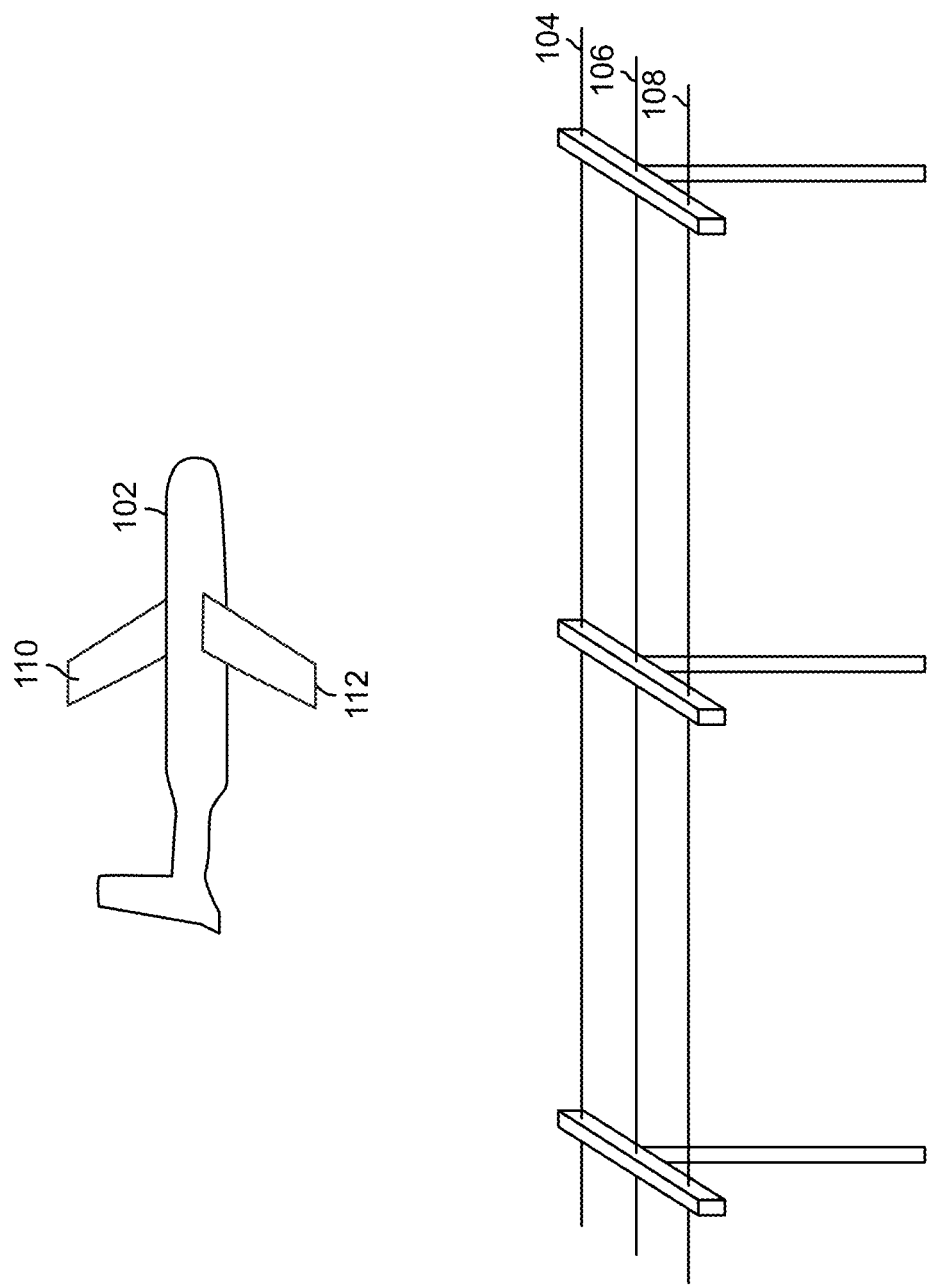

MAGNETIC NAVIGATION METHODS AND SYSTEMS UTILIZING POWER GRID AND COMMUNICATION NETWORK

The present application claims the benefit of U.S. Provisional Application Nos. 62/109,006, filed Jan. 28, 2015, and 62/109,551, filed Jan. 29, 2015, each of which is incorporated by reference herein in its entirety. The present application is related to co-pending U.S. application Ser. No. 15/003,193, filed Jan. 21, 2016, titled "RAPID HIGH-RESOLUTION MAGNETIC FIELD MEASUREMENTS FOR POWER LINE INSPECTION," which is incorporated by reference herein in its entirety. The present application is also related to co-pending U.S. application Ser. No. 15/003,088, filed Jan. 21, 2016, titled "IN-SITU POWER CHARGING", which is incorporated by reference herein in its entirety.

FIELD

The disclosure generally relates to magnetometer systems, and more particularly, to diamond nitrogen-vacancy (DNV) magnetometer systems utilizing human infrastructure with characteristic magnetic signatures and broad geographical distribution, such as power lines and cellular communications networks, for magnetic navigation.

BACKGROUND

Small unmanned aircraft systems (UASs) typically navigate using GPS and fly at a nominal altitude to avoid obstructions on the earth surface. When GPS is not available or intentionally denied, a UAS may not be able to accurately navigate to its destination as its inertial navigation system (INS) may drift. Visual flight references can sometimes be used to remove INS errors. However, there are several deficiencies. For example, the fact that a UAS has to fly at relatively high altitudes to provide a visual sample space of sufficient geographic coverage to locate its position makes the UAS more vulnerable to detection. Further, a large image database has to be either carried on-board, which impacts platform endurance, or a data-link is required to reach back to an off-board processor. Accessing an off-board processor may not be practical in contested environments. Visual flight references can also be impacted by varied lighting conditions, and are ineffective in degraded visibility environments.

Sometimes synthetic aperture radar (SAR) and passive coherent location (PCL) may be utilized and can provide non real-time data such that the system can build an image of the terrain to its side after it has flown by the area of interest. SAR, nonetheless, requires the sensor to operate at a higher altitude that exposes it to detection. Further, SAR may require substantial on-board computing resources and emits RF energy that may unintentionally reveal the location of the UAS. Passive measurements of RF emissions (e.g., TV and FM radio transmitters) can be used to measure location when RF transmitters are operating and their location(s) are known. PCL requires multiple known RF emitters to triangulate position, and position accuracy may be limited by the type and number of transmitters detected, and by multi-path errors.

SUMMARY

Methods and systems are described for exploiting magnetic signature characteristics of electrical power transmission, distribution lines, communication networks and other magnetic sources for navigation. In the following description, reference is made to the accompanying attachments that form a part thereof, and in which are shown by way of illustration, specific embodiments in which the technology may be practiced. It is to be understood that other embodiments may be utilized and changes may be made without departing from the scope of the disclosure. For example, the same principals disclosed apply to ground autonomous vehicles that can follow the same overhead and buried power lines, and to undersea autonomous vehicles that can follow submerged power cables and other infrastructure, or other networks generating magnetic fields. In addition, groups of unmanned systems may improve the scope, accuracy and types of features represented in the magnetic database described below. Magnetic metadata for way-point determination and other applications such as homing can be collected with the system and method described. Metadata can be compiled in a central database and/or shared in real-time with other platforms and sensors for navigation and homing. In addition, platforms may coordinate their information with other platforms to allow more distant platforms, with or without a magnetic sensor, to more accurately locate position.

BRIEF DESCRIPTION OF THE DRAWINGS

The foregoing and other features of this disclosure will become more fully apparent from the following description and appended claims, taken in conjunction with the accompanying drawings. Understanding that these drawings depict only several implementations in accordance with the disclosure and are, therefore, not to be considered limiting of its scope, the disclosure will be described with additional specificity and detail through use of the accompanying drawings.

FIG. 1 illustrates a low altitude flying object in accordance with some illustrative implementations.

DETAILED DESCRIPTION

In some embodiments, methods and configurations are disclosed for diamond nitrogen-vacancy (DNV) magnetic navigation via power transmission and distribution lines. The characteristic magnetic signature of human infrastructure provides context for navigation. For example, power lines, which have characteristic magnetic signatures, can serve as roads and highways for mobile platforms (e.g., UASs). Travel in relatively close proximity to power lines may allow stealthy transit, may provide the potential for powering the mobile platform itself, and may permit point-to-point navigation both over long distances and local routes.

Some implementations can include one or more magnetic sensors, a magnetic navigation database, and a feedback loop that controls the UAS position and orientation. DNV magnetic sensors and related systems and methods may provide high sensitivity magnetic field measurements. The DNV magnetic systems and methods can also be low cost, space, weight, and power (C-SWAP) and benefit from a fast settling time. The DNV magnetic field measurements may allow UASs to align themselves with the power lines, and to rapidly move along the power-line infrastructure routes. The subject solution can enable navigation in poor visibility conditions and/or in GPS-denied environments. Such magnetic navigation allows for UAS operation in close proximity to power lines facilitating stealthy transit. DNV-based magnetic systems and methods can be approximately 100 times smaller than conventional systems and can have a reaction time that that is approximately 100,000 times faster than other systems.

Figure 2A:
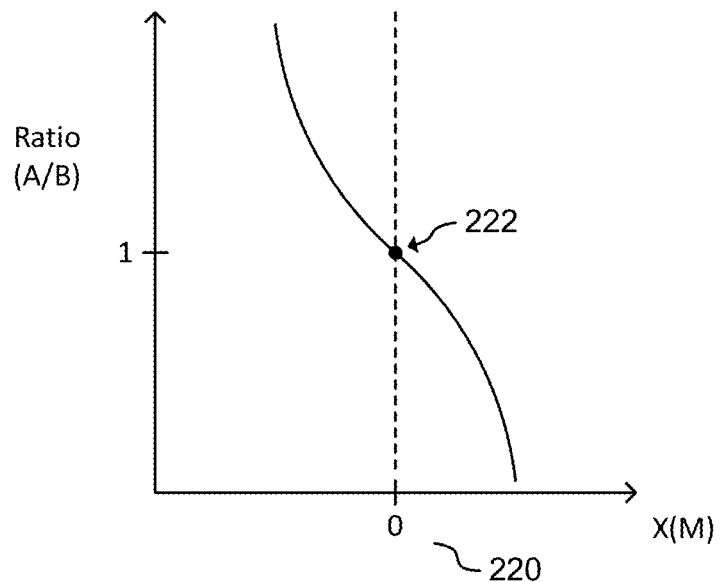
FIG. 2A illustrates a ratio of signal strength of two magnetic sensors, A and B, attached to wings of the UAS 102 as a function of distance, x, from a center line of a power in accordance with some illustrative implementations.

FIG. 1 is a diagram illustrating an example of UAS 102 navigation along power lines 104, 106, and 108, according to some implementations of the subject technology. The UAS 102 can exploit the distinct magnetic signatures of power lines for navigation such that the power lines can serve as roads and highways for the UAS 102 without the need for detailed a priori knowledge of the route magnetic characteristics. As shown in FIG. 2A, a ratio of signal strength of two magnetic sensors, A and B (110 and 112 in FIG. 1), attached to wings of the UAS 102, varies as a function of distance, x, from a center line of an example three-line power transmission line structure 104, 106, and 108. When the ratio is near 1, point 222, the UAS 102 is centered over the power transmission line structure, x=0 at point 220.

Figure 2B:
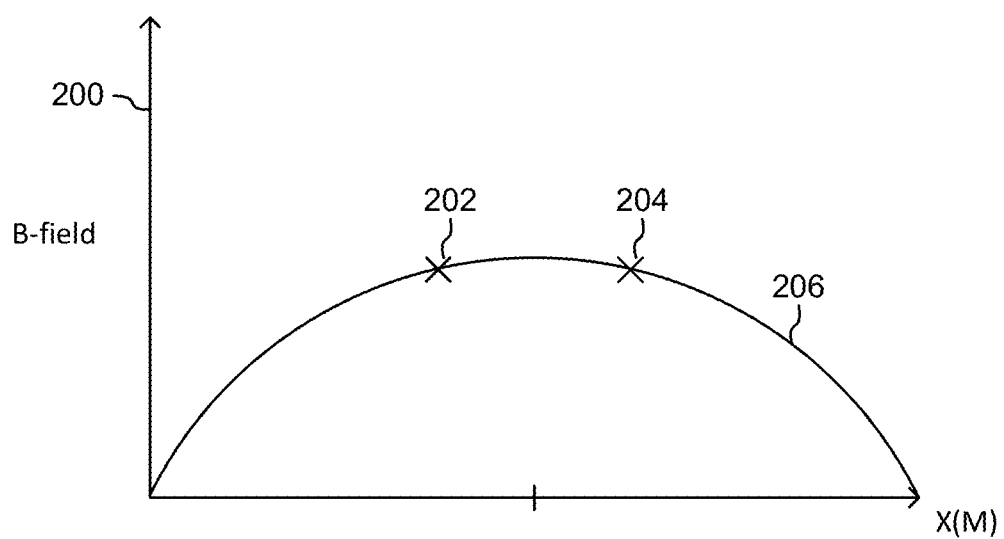
FIG. 2B illustrates a composite magnetic field (B-field) in accordance with some illustrative implementations.

A composite magnetic field (B-field) 206 from all (3) wires shown in FIG. 2B. This field is an illustration of the strength of the magnetic field measured by one or more magnetic sensors in the UAS. In this example, the peak of the field 208 corresponds to the UAS 102 being above the location of the middle line 106. When the UAS 102 has two magnetic sensors, the sensors would read strengths corresponding to points 202 and 204. A computing system on the UAS or remote from the UAS, can calculate combined readings. Not all of the depicted components may be required, however, and one or more implementations may include additional components not shown in the figure. Variations in the arrangement and type of the components may be made, and additional components, different components, or fewer components may be provided.

As an example of some implementations, a vehicle, such as a UAS, can include one or more navigation sensors, such as DNV sensors. The vehicle's mission could be to travel to an initial destination and possibly return to a final destination. Known navigation systems can be used to navigate the vehicle to an intermediate location. For example, a UAS can fly using GPS and/or human controlled navigation to the intermediate location. The UAS can then begin looking for the magnetic signature of a power source, such as power lines. To find a power line, the UAS can continually take measurements using the DNV sensors. The UAS can fly in a circle, straight line, curved pattern, etc. and monitor the recorded magnetic field. The magnetic field can be compared to known characteristics of power lines to identify if a power line is in the vicinity of the UAS. For example, the measured magnetic field can be compared with known magnetic field characteristics of power lines to identify the power line that is generating the measured magnetic field. In addition, information regarding the electrical infrastructure can be used in combination with the measured magnetic field to identify the current source. For example, a database regarding magnetic measurements from the area that were previously taken and recorded can be used to compare the current readings to help determine the UAS's location.

In some implementations, once the UAS identifies a power line the UAS positions itself at a known elevation and position relative to the power line. For example, as the UAS flies over a power line, the magnetic field will reach a maximum value and then begin to decrease as the UAS moves away from the power line. After one sweep of a known distance, the UAS can return to where the magnetic field was the strongest. Based upon known characteristics of power lines and the magnetic readings, the UAS can determine the type of power line.

Figure 6:
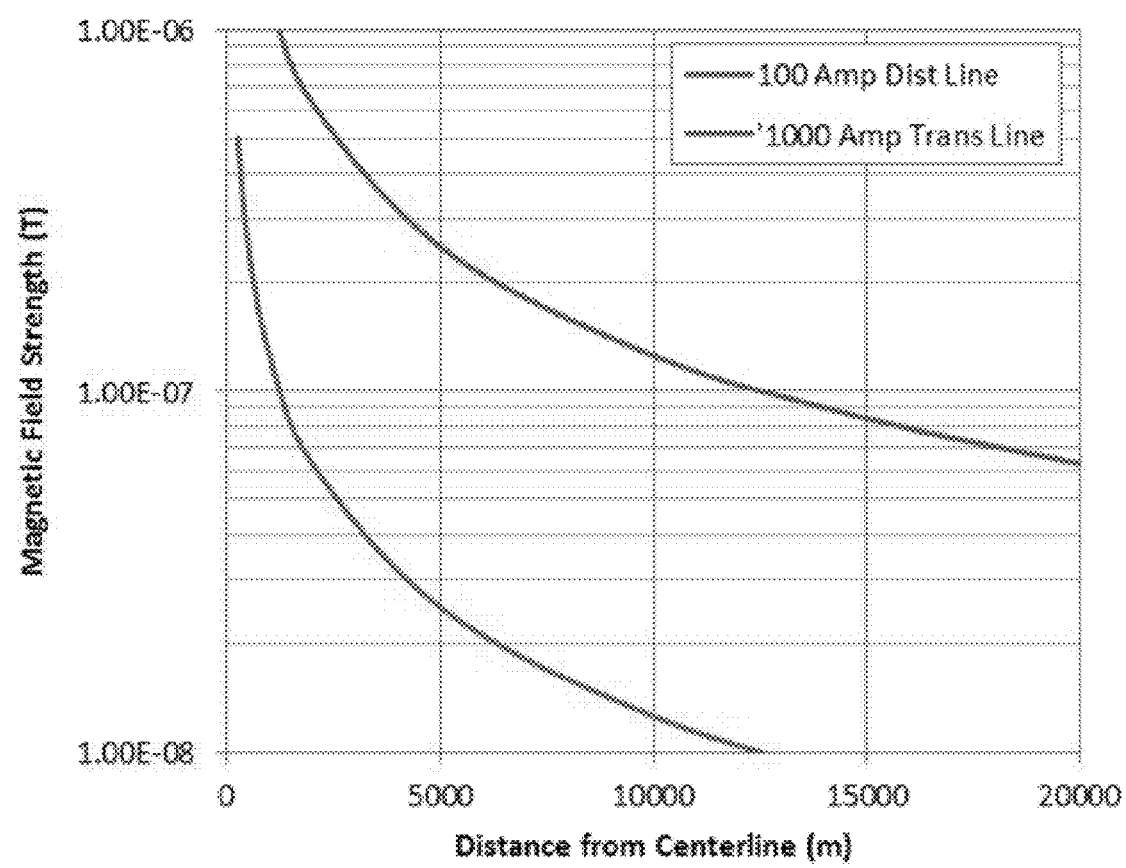
FIG. 6 illustrates examples of magnetic field strength of power lines as a function of distance from the centerline.

Once the current source has been identified, the UAS can change its elevation until the magnetic field is a known value that corresponds with an elevation above the identified power line. For example, as shown in FIG. 6, a magnetic field strength can be used to determine an elevation above the current source. The UAS can also use the measured magnetic field to position itself offset from directly above the power line. For example, once the UAS is positioned above the current source, the UAS can move laterally to an offset position from the current source. For example, the UAS can move to be 10 kilometers to the left or right of the current source.

The UAS can be programmed, via a computer 306, with a flight path. In some implementations, once the UAS establishes its position, the UAS can use a flight path to reach its destination. In some implementations, the magnetic field generated by the transmission line is perpendicular to the transmission line. In some implementations, the vehicle will fly perpendicular to the detected magnetic field. In one example, the UAS can follow the detected power line to its destination. In this example, the UAS will attempt to keep the detected magnetic field to be close to the original magnetic field value. To do this, the UAS can change elevation or move laterally to stay in its position relative to the power line. For example, a power line that is rising in elevation would cause the detected magnetic field to increase in strength as the distance between the UAS and power line decreased. The navigation system of the UAS can detect this increased magnetic strength and increase the elevation of the UAS. In addition, on board instruments can provide an indication of the elevation of the UAS. The navigation system can also move the UAS laterally to the keep the UAS in the proper position relative to the power lines.

The magnetic field can become weaker or stronger, as the UAS drifts from its position of the transmission line. As the change in the magnetic field is detected, the navigation system can make the appropriate correction. For a UAS that only has a single DNV sensor, when the magnetic field had decreased by more than a predetermined amount the navigation system can make corrections. For example, the UAS can have an error budget such that the UAS will attempt to correct its course if the measured error is greater than the error budget. If the magnetic field has decreased, the navigation system can instruct the UAS to move to the left. The navigation system can continually monitor the magnetic field to see if moving to the left corrected the error. If the magnetic field further decreased, the navigation system can instruct the UAS to fly to the right to its original position relative to the current source and then move further to the right. If the magnetic field decreased in strength, the navigation system can deduce that the UAS needs to decrease its altitude to increase the magnetic field. In this example, the UAS would originally be flying directly over the current source, but the distance between the current source and the UAS has increased due to the current source being at a lower elevation. Using this feedback loop of the magnetic field, the navigation system can keep the UAS centered or at an offset of the current source. The same analysis can be done when the magnetic field increases in strength. The navigation can maneuver until the measured magnetic field is within the proper range such that the UAS in within the flight path.

The UAS can also use the vector measurements from one or more DNV sensors to determine course corrections. The readings from the DNV sensor are vectors that indicate the direction of the sensed magnetic field. Once the UAS knows the location of the power line, as the magnitude of the sensed magnetic field decreases, the vector can provide an indication of the direction the UAS should move to correct its course. For example, the strength of the magnetic field can be reduced by a threshold amount from its ideal location. The magnetic vector of this field can be used to indicate the direction the UAS should correct to increase the strength of the magnetic field. In other words, the magnetic field indicates the direction of the field and the UAS can use this direction to determine the correct direction needed to increase the strength of the magnetic field, which could correct the UAS flight path to be back over the transmission wire.

Using multiple sensors on a single vehicle can reduce the amount of maneuvering that is needed or eliminate the maneuvering all together. Using the measured magnetic field from each of the multiple sensors, the navigation system can determine if the UAS needs to correct its course by moving left, right, up, or down. For example, if both DNV sensors are reading a stronger field, the navigation system can direct the UAS to increase its altitude. As another example if the left sensor is stronger than expected but the right sensor is weaker than expected, the navigation system can move the UAS to the left.

In addition to the current readings from the one or more sensors, a recent history of readings can also be used by the navigation system to identify how to correct the UAS course. For example, if the right sensor had a brief increase in strength and then a decrease, while the left sensor had a decrease, the navigation system can determine that the UAS has moved to far to the left of the flight path and could correct the position of the UAS accordingly.

Figure 3:
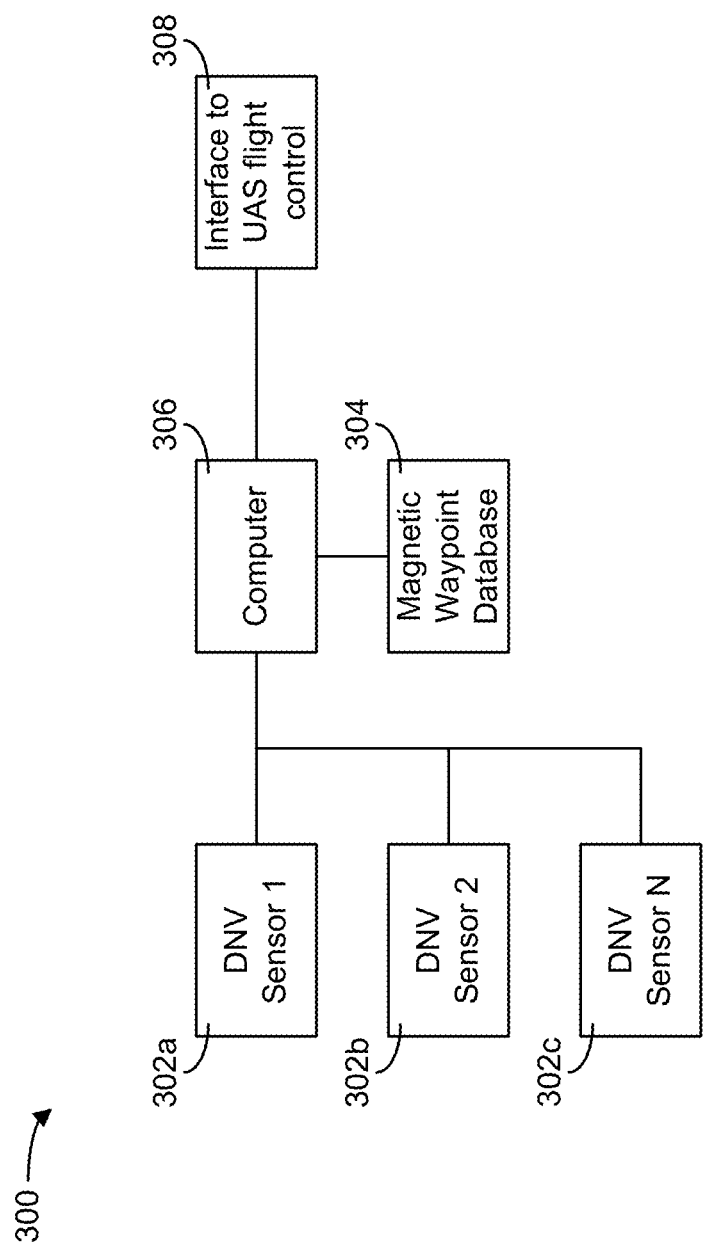
FIG. 3 illustrates a high-level block diagram of an example UAS navigation system in accordance with some illustrative implementations.

FIG. 3 illustrates a high-level block diagram of an example UAS navigation system 300, according to some implementations of the subject technology. In some implementations, the UAS navigation system of the subject technology includes a number of DNV sensors 302a, 302b, and 302c, a navigation database 304, and a feedback loop that controls the UAS position and orientation. In other implementations, a vehicle can contain a navigation control that is used to navigate the vehicle. For example, the navigation control can change the vehicle's direction, elevation, speed, etc. The DNV magnetic sensors 302a-302c have high sensitivity to magnetic fields, low C-SWAP and a fast settling time. The DNV magnetic field measurements allow the UAS to align itself with the power lines, via its characteristic magnetic field signature, and to rapidly move along power-line routes. Not all of the depicted components may be required, however, and one or more implementations may include additional components not shown in the figure. Variations in the arrangement and type of the components may be made, and additional components, different components, or fewer components may be provided.

Figure 4:
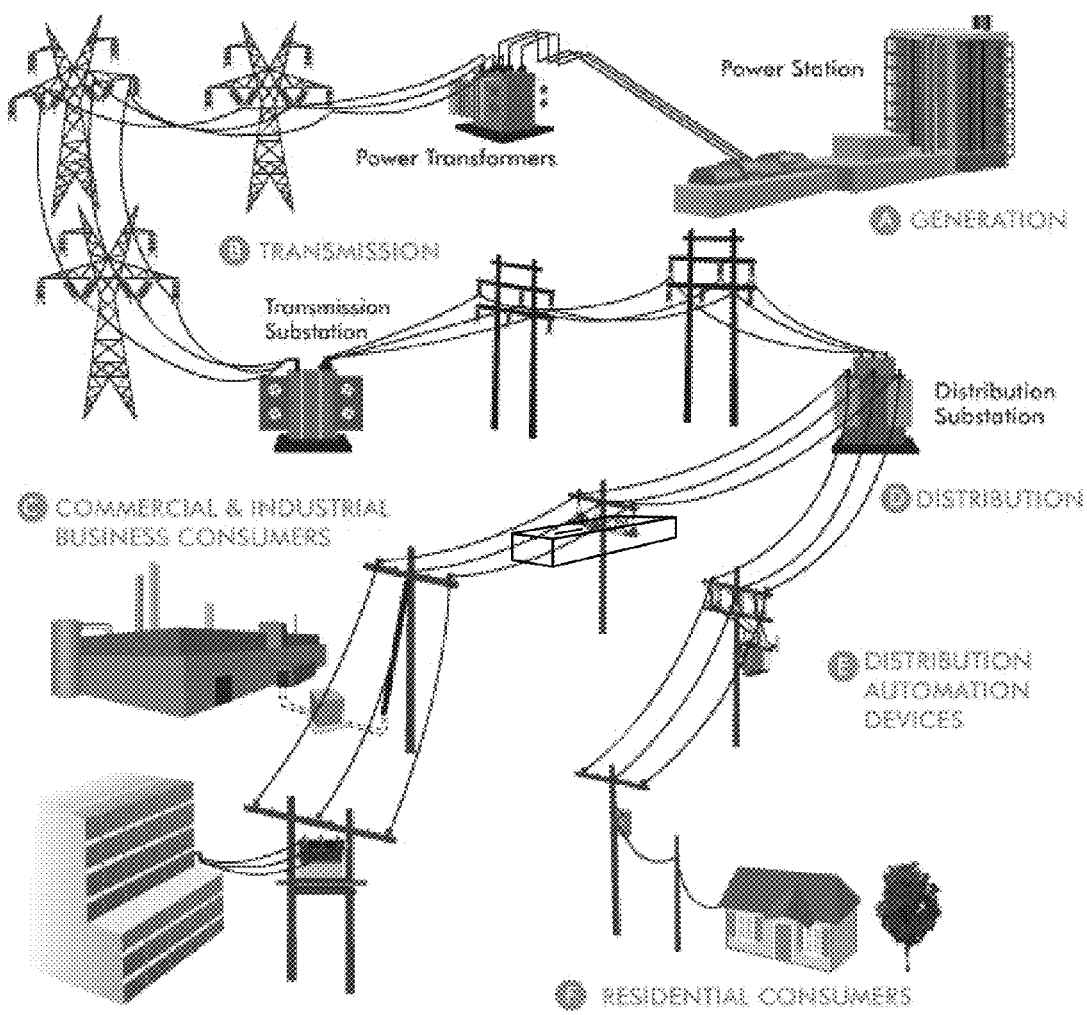
FIG. 4 illustrates an example of a power line infrastructure.

FIG. 4 illustrates an example of a power line infrastructure. It is known that widespread power line infrastructures, such as shown in FIG. 4, connect cities, critical power system elements, homes and businesses. The infrastructure may include overhead and buried power distribution lines, transmission lines, railway catenary and $3^{rd}$ rail power lines and underwater cables. Each element has a unique electromagnetic and spatial signature. It is understood that, unlike electric fields, the magnetic signature is minimally impacted by man-made structures and electrical shielding. It is understood that specific elements of the infrastructure will have distinct magnetic and spatial signatures and that discontinuities, cable droop, power consumption and other factors will create variations in magnetic signatures that can also be leveraged for navigation.

Figure 5A:
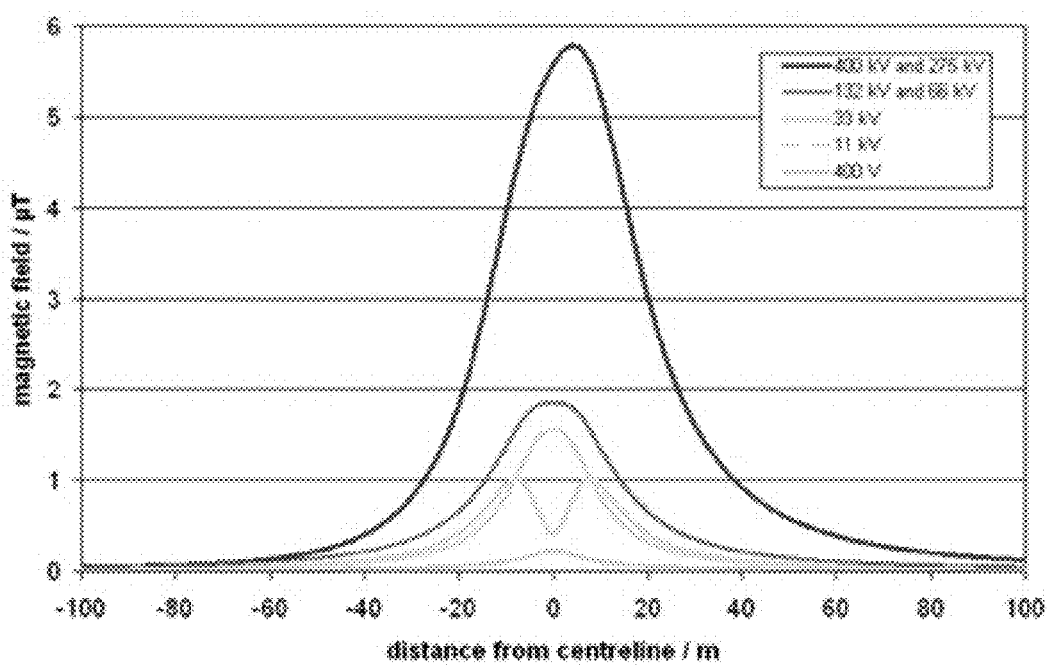
FIGS. 5A and 5B illustrate examples of magnetic field distribution for overhead power lines and underground power cables.
Figure 5B:
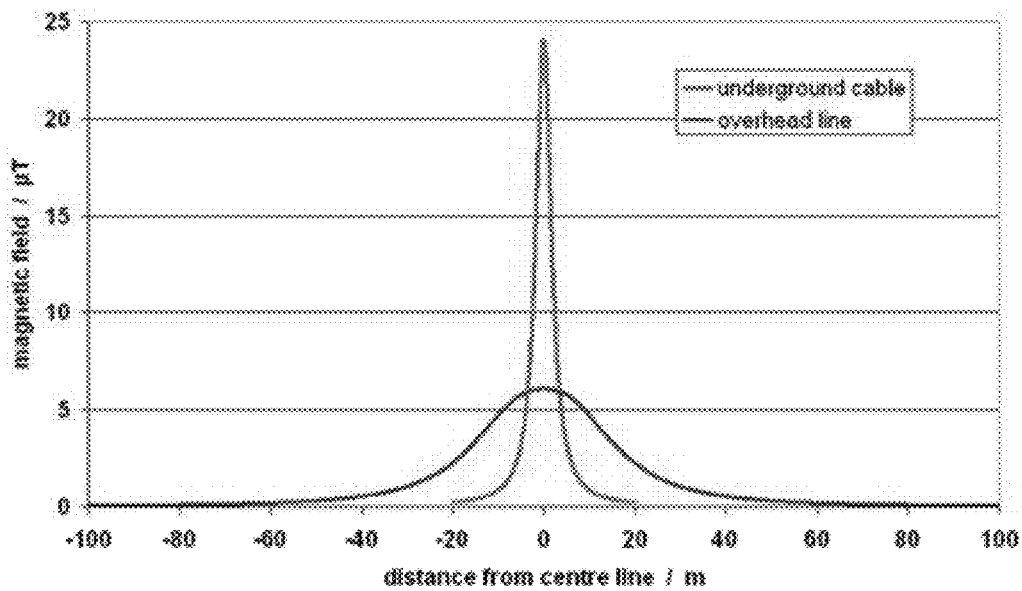

FIGS. 5A and 5B illustrate examples of magnetic field distribution for overhead power lines and underground power cables. Both above-ground and buried power cables emit magnetic fields, which unlike electrical fields are not easily blocked or shielded. Natural Earth and other man-made magnetic field sources can provide rough values of absolute location. However, the sensitive magnetic sensors described here can locate strong man-made magnetic sources, such as power lines, at substantial distances. As the UAS moves, the measurements can be used to reveal the spatial structure of the magnetic source (point source, line source, etc.) and thus identify the power line as such. In addition, once detected the UAS can guide itself to the power line via its magnetic strength. Once the power line is located its structure is determined, and the power line route is followed and its characteristics are compared to magnetic way points to determine absolute location. Fixed power lines can provide precision location reference as the location and relative position of poles and towers are known. A compact on-board database can provide reference signatures and location data for waypoints. Not all of the depicted components may be required, however, and one or more implementations may include additional components not shown in the figure. Variations in the arrangement and type of the components may be made, and additional components, different components, or fewer components may be provided.

FIG. 6 illustrates examples of magnetic field strength of power lines as a function of distance from the centerline showing that even low current distribution lines can be detected to distances in excess of 10 km. Here it is understood that DNV sensors provide 0.01 uT sensitivity (1e-10 T), and modeling results indicates that high current transmission line (e.g. with 1000 A-4000 A) can be detected over many tens of km. These strong magnetic sources allow the UAS to guide itself to the power lines where it can then align itself using localized relative field strength and the characteristic patterns of the power-line configuration as described below.

Figure 7:
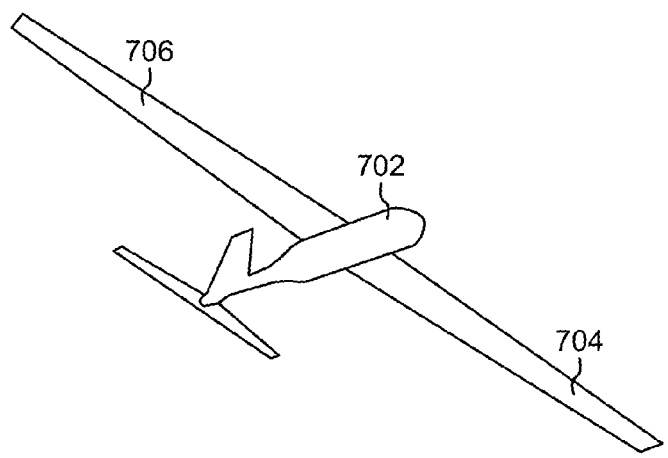
FIG. 7 illustrates an example of a UAS equipped with DNV sensors in accordance with some illustrative implementations.
Figure 8:
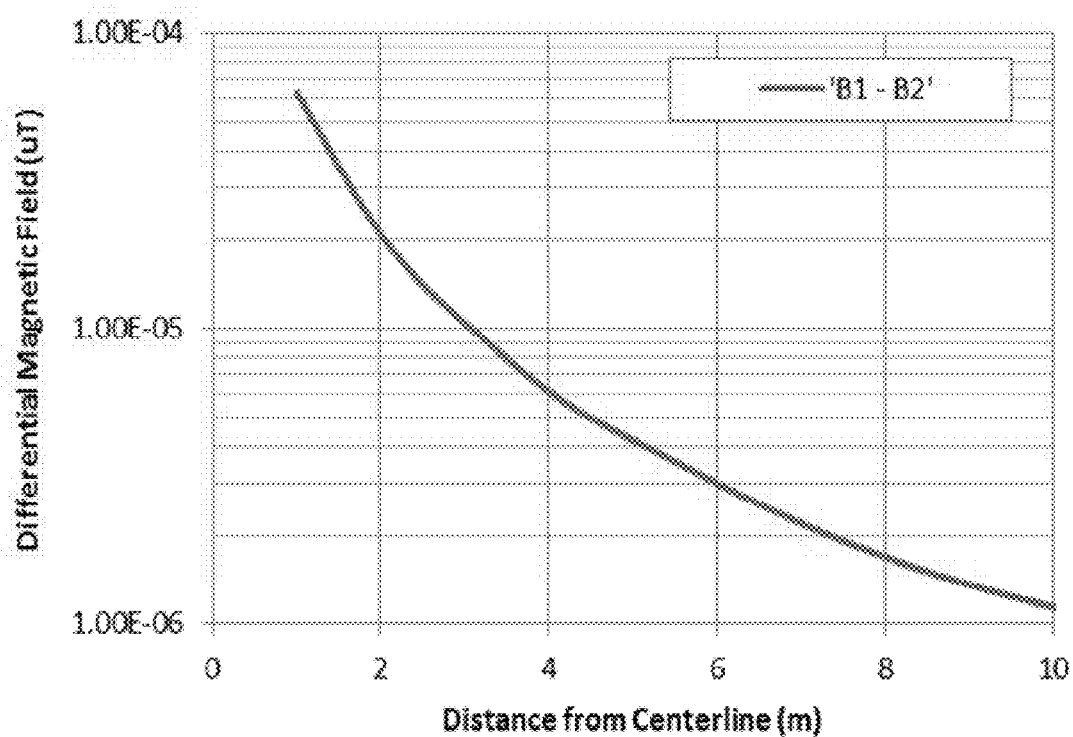
FIG. 8 illustrates a plot of a measured differential magnetic field sensed by the DNV sensors when in close proximity of the power lines in accordance with some illustrative implementations.

FIG. 7 illustrates an example of a UAS 702 equipped with DNV sensors 704 and 706. FIG. 8 is a plot of a measured differential magnetic field sensed by the DNV sensors when in close proximity of the power lines. While power line detection can be performed with only a single DNV sensor precision alignment for complex wire configurations can be achieved using multiple arrayed sensors. For example, the differential signal can eliminate the influence of diurnal and seasonal variations in field strength. Not all of the depicted components may be required, however, and one or more implementations may include additional components not shown in the figure. Variations in the arrangement and type of the components may be made, and additional components, different components, or fewer components may be provided.

In various other implementations, a vehicle can also be used to inspect power transmission lines, power lines, and power utility equipment. For example, a vehicle can include one or more magnetic sensors, a magnetic waypoint database, and an interface to UAS flight control. The subject technology may leverage high sensitivity to magnetic fields of DNV magnetic sensors for magnetic field measurements. The DNV magnetic sensor can also be low cost, space, weight, and power (C-SWAP) and benefit from a fast settling time. The DNV magnetic field measurements allow UASs to align themselves with the power lines, and to rapidly move along power-line routes and navigate in poor visibility conditions and/or in GPS-denied environments. It is understood that DNV-based magnetic sensors are approximately 100 times smaller than conventional magnetic sensors and have a reaction time that that is approximately 100,000 times faster than sensors with similar sensitivity such as the EMDEX LLC Snap handheld magnetic field survey meter.

The fast settling time and low C-SWAP of the DNV sensor enables rapid measurement of detailed power line characteristics from low-C-SWAP UASs. In one or more implementations, power lines can be efficiently surveyed via small unmanned aerial vehicles (UAVs) on a routine basis over long distance, which can identify emerging problems and issues through automated field anomaly identification. In other implementations, a land based vehicle or submersible can be used to inspect power lines. Human inspectors are not required to perform the initial inspections. The inspections of the subject technology are quantitative, and thus are not subject to human interpretation as remote video solutions may be.

Figure 9:
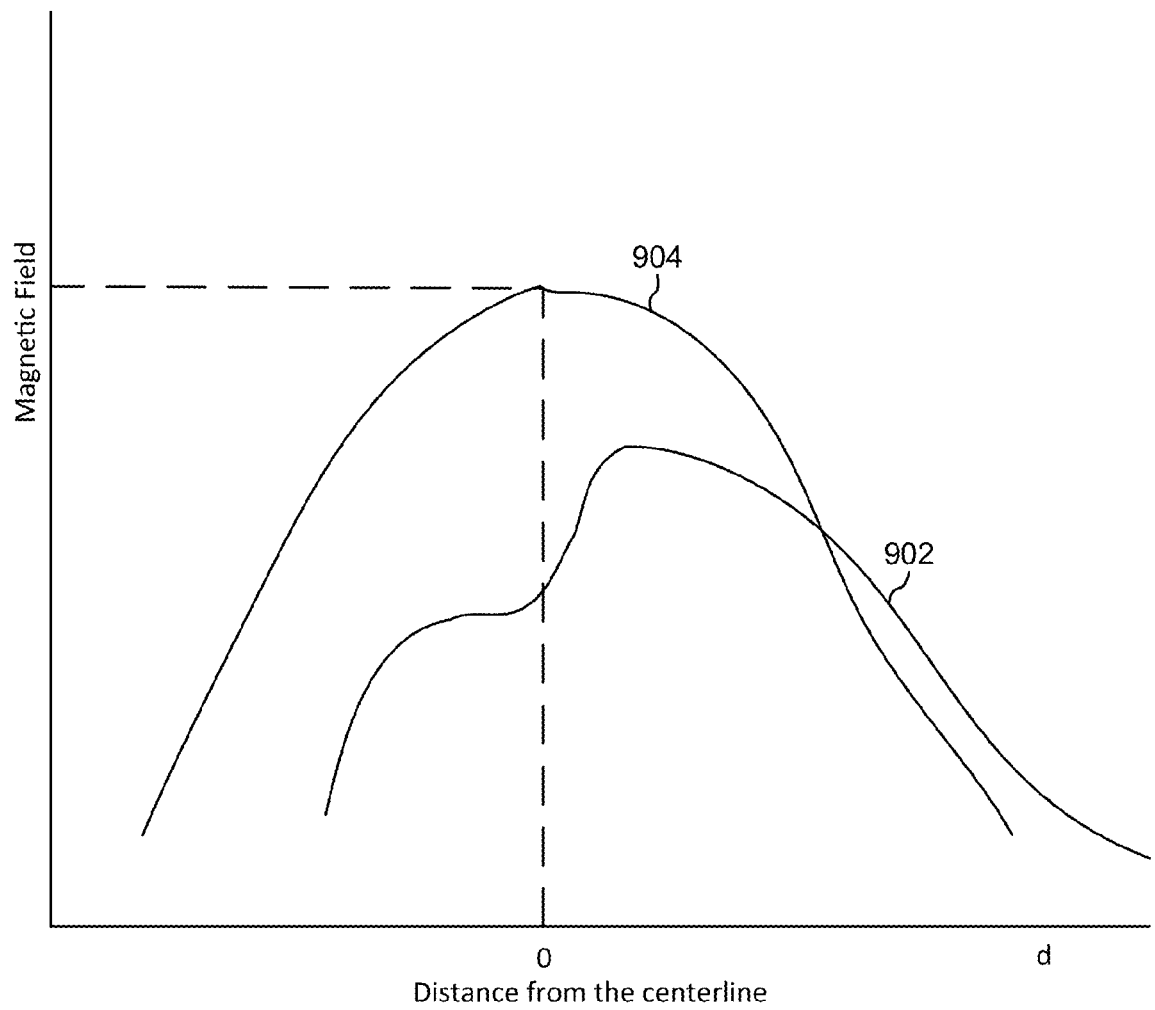
FIG. 9 illustrates an example of a measured magnetic field distribution for normal power lines and power lines with anomalies according to some implementations.

FIG. 9 illustrates an example of a measured magnetic field distribution for power lines 904 and power lines with anomalies 902 according to some implementations. The peak value of the measured magnetic field distribution, for the normal power lines, is in the vicinity of the centerline (e.g., d=0). The inspection method of the subject technology is a high-speed anomaly mapping technique that can be employed for single and multi-wire transmission systems. The subject solution can take advantage of existing software modeling tools for analyzing the inspection data. In one or more implementations, the data form a normal set of power lines may be used as a comparison reference for data resulting from inspection of other power lines (e.g., with anomalies or defects). Damage to wires and support structure alters the nominal magnetic field characteristics and is detected by comparison with nominal magnetic field characteristics of the normal set of power lines. It is understood that the magnetic field measurement is minimally impacted by other structures such as buildings, trees, and the like. Accordingly, the measured magnetic field can be compared to the data from the normal set of power lines and the measured magnetic field's magnitude and if different by a predetermined threshold the existence of the anomaly can be indicated. In addition, the vector reading between the difference data can also be compared and used to determine the existence of anomaly.

In some implementations, a vehicle may need to avoid objects that are in their navigation path. For example, a ground vehicle may need to maneuver around people or objects, or a flying vehicle may need to avoid a building or power line equipment. In these implementations, the vehicle can be equipment with sensors that are used to locate the obstacles that are to be avoided. Systems such as a camera system, focal point array, radar, acoustic sensors, etc., can be used to identify obstacles in the vehicles path. The navigation system can then identify a course correction to avoid the identified obstacles.

Figure 10:
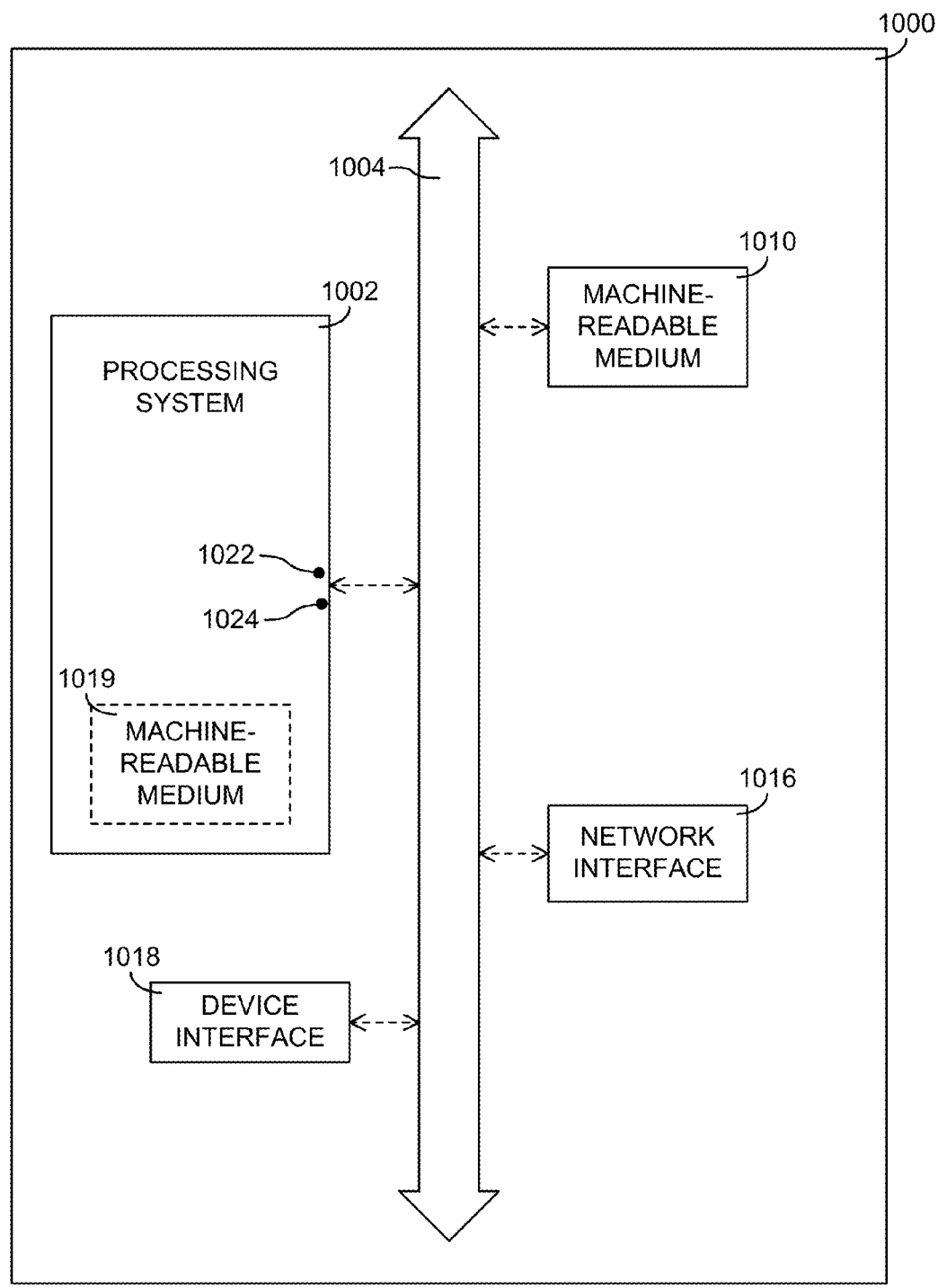
FIG. 10 is a diagram illustrating an example of a system for implementing some aspects of this disclosure in accordance with some implementations.

FIG. 10 is a diagram illustrating an example of a system 1000 for implementing some aspects of the subject technology. The system 1000 includes a processing system 1002, which may include one or more processors or one or more processing systems. A processor can be one or more processors. The processing system 1002 may include a general-purpose processor or a specific-purpose processor for executing instructions and may further include a machine-readable medium 1019, such as a volatile or non-volatile memory, for storing data and/or instructions for software programs. The instructions, which may be stored in a machine-readable medium 1010 and/or 1019, may be executed by the processing system 1002 to control and manage access to the various networks, as well as provide other communication and processing functions. The instructions may also include instructions executed by the processing system 1002 for various user interface devices. The processing system 1002 may include an input port 1022 and an output port 1024. Each of the input port 1022 and the output port 1024 may include one or more ports. The input port 1022 and the output port 1024 may be the same port (e.g., a bi-directional port) or may be different ports.

The processing system 1002 may be implemented using software, hardware, or a combination of both. By way of example, the processing system 1002 may be implemented with one or more processors. A processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable device that can perform calculations or other manipulations of information.

A machine-readable medium can be one or more machine-readable media. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media (e.g., 1019) may include storage integrated into a processing system such as might be the case with an ASIC. Machine-readable media (e.g., 1010) may also include storage external to a processing system, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. Those skilled in the art will recognize how best to implement the described functionality for the processing system 1002. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions may be executable, for example, by the processing system 1002 or one or more processors. Instructions can be, for example, a computer program including code for performing methods of the subject technology.

A network interface 1016 may be any type of interface to a network (e.g., an Internet network interface), and may reside between any of the components shown in FIG. 10 and coupled to the processor via the bus 1004.

A device interface 1018 may be any type of interface to a device and may reside between any of the components shown in FIG. 10. A device interface 1018 may, for example, be an interface to an external device (e.g., USB device) that plugs into a port (e.g., USB port) of the system 1000.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

One or more of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

In some aspects, the subject technology is directed to DNV application to magnetic navigation via power lines. In some aspects, the subject technology may be used in various markets, including for example and without limitation, advanced sensors and mobile space platforms.

The description of the subject technology is provided to enable any person skilled in the art to practice the various embodiments described herein. While the subject technology has been particularly described with reference to the various figures and embodiments, it should be understood that these are for illustration purposes only and should not be taken as limiting the scope of the subject technology.

There may be many other ways to implement the subject technology. Various functions and elements described herein may be partitioned differently from those shown without departing from the scope of the subject technology. Various modifications to these embodiments may be readily apparent to those skilled in the art, and generic principles defined herein may be applied to other embodiments. Thus, many changes and modifications may be made to the subject technology, by one having ordinary skill in the art, without departing from the scope of the subject technology.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various embodiments described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. An aerial vehicle with automatic navigation comprising:
one or more diamond nitrogen vacancy (DNV) sensors spaced apart from each other and each configured to detect magnetic fields generated by stationary infrastructure, such one or more DNV sensors determining a magnetic vector based on the magnetic fields, such infrastructure spaced apart from the one or more DNV sensors and providing a magnetic signature that is capable of being mapped based on characteristics of the magnetic signature and correlated to sensed magnetic vectors;
one or more electronic processors configured to receive the magnetic vector of the magnetic field and determine a presence of infrastructure based upon the magnetic vector; and
a navigation control configured to automatically navigate the aerial vehicle based upon the infrastructure and its weak magnetic fields detected and determined as magnetic vectors.

2. The aerial vehicle of claim 1, wherein the navigation control is further configured to navigate to an initial position.

3. The aerial vehicle of claim 2, wherein the navigation control is further configured to navigate the vehicle in a pattern over an area.

4. The vehicle of claim 1, wherein the vehicle is a ground vehicle.

5. The vehicle of claim 1, wherein the vehicle is a submersible vehicle.

6. A vehicle with automatic navigation comprising:
one or more diamond nitrogen vacancy (DNV) sensors spaced apart from each other and each configured to detect magnetic fields generated by stationary infrastructure, such one or more DNV sensors determining a plurality of magnetic vectors based on the magnetic fields, such infrastructure spaced apart from the one or more DNV sensors and providing a magnetic signature that is capable of being mapped based on characteristics of the magnetic signature and correlated to sensed magnetic vectors;
one or more electronic processors configured to:
receive a plurality of magnetic vectors from the magnetometer corresponding to readings in the area; and
determine a maximum magnitude from the plurality of magnetic vectors, wherein the maximum magnitude corresponds to a location of the current source; and
a navigation control configured to automatically navigate the vehicle based upon the infrastructure and its weak magnetic fields detected and determined as magnetic vectors.

7. The vehicle of claim 6, wherein the location of the vehicle is a position directly above the current source.

8. The vehicle of claim 7, wherein the one or more electronic processors are further configured to:
receive a second plurality of real-time magnetic vectors from the magnetometer; and
determine a course correction for the vehicle based upon the second plurality of magnetic vectors.

9. The vehicle of claim 8, wherein the vehicle is a flying vehicle.

10. The vehicle of claim 9, wherein the one or more electronic processors are further configured to:
compare the second plurality of magnetic vectors to data corresponding to a known magnetic field generated by the current source;
determine a target magnetic field corresponding with a set distance above the power source;
determine altitude adjustment data based upon the comparison; and
provide the altitude adjustment data to the navigation control;
wherein the navigation control is further configured to adjust the altitude of the flying vehicle based upon the altitude adjustment data.

11. The vehicle of claim 7, wherein the one or more electronic processors are further configured to:
determine a target magnetic field corresponding with a set distance laterally offset from an initial point relative to the current source;
compare the second plurality of magnetic vectors to data corresponding to a known magnetic field generated by the current source;
determine lateral adjustment data based upon the comparison; and
provide the lateral adjustment data to the navigation control;
wherein the navigation control is further configured to adjust the position of the vehicle based upon the lateral adjustment data.

12. A system for navigating a vehicle comprising:
a magnetometer configured to detect a magnetic vector of a magnetic field;
one or more electronic processors configured to:
receive the magnetic vector of the magnetic field from the magnetometer; and
determine a presence of a current source based upon the magnetic vector; and
a navigation control configured to navigate the vehicle based upon the presence of the current source and the magnetic vector;
wherein the navigation control is further configured to navigate to an initial position.

13. The system of claim 12, wherein the navigation control is further configured to navigate the vehicle in a pattern over an area.

14. The system of claim 13, wherein the one or more electronic processors are further configured to:
receive a plurality of magnetic vectors from the magnetometer corresponding to readings in the area; and
determine a maximum magnitude from the plurality of magnetic vectors, wherein the maximum magnitude corresponds to a location of the current source.

15. The system of claim 14, wherein the location of the vehicle is a position directly above the current source.

16. The system of claim 15, wherein the one or more electronic processors are further configured to:
receive a second plurality of real-time magnetic vectors from the magnetometer;
determine a course correction for the vehicle based upon the second plurality of magnetic vectors.

17. The system of claim 16, wherein the vehicle is a flying vehicle.

18. The system of claim 17, wherein the one or more electronic processors are further configured to:
compare the second plurality of magnetic vectors to data corresponding to a known magnetic field generated by the current source;
determine a target magnetic field corresponding with a set distance above the power source;
determine altitude adjustment data based upon the comparison; and provide the altitude adjustment data to the navigation control;
wherein the navigation control is further configured to adjust the altitude of the flying vehicle based upon the altitude adjustment data.

19. The system of claim 15, wherein the one or more electronic processors are further configured to:
determine a target magnetic field corresponding with a set distance laterally offset from an initial point relative to the current source;
compare the second plurality of magnetic vectors to data corresponding to a known magnetic field generated by the current source;
determine lateral adjustment data based upon the comparison; and
provide the lateral adjustment data to the navigation control;
wherein the navigation control is further configured to adjust the position of the vehicle based upon the lateral adjustment data.

20. A system for navigating a vehicle comprising:
a magnetometer configured to detect a magnetic vector of a magnetic field;
one or more electronic processors configured to:
receive the magnetic vector of the magnetic field from the magnetometer; and
determine a presence of a current source based upon the magnetic vector; and
a navigation control configured to navigate the vehicle based upon the presence of the current source and the magnetic vector;
wherein the vehicle is a ground vehicle.

21. A system for navigating a vehicle comprising:
a magnetometer configured to detect a magnetic vector of a magnetic field;
one or more electronic processors configured to:
receive the magnetic vector of the magnetic field from the magnetometer; and
determine a presence of a current source based upon the magnetic vector; and
a navigation control configured to navigate the vehicle based upon the presence of the current source and the magnetic vector;
wherein the vehicle is a submersible vehicle.

22. A system for navigating a vehicle comprising:
a plurality of magnetometers configured to detect a plurality of magnetic vectors of a magnetic field;
one or more electronic processors configured to:
receive the plurality of magnetic vectors of the magnetic field from the plurality of magnetometers; and
determine a presence of a current source based upon the plurality of magnetic vectors; and
a navigation control configured to navigate the vehicle based upon the presence of the current source and the magnetic vector.

23. The system of claim 22, wherein the one or more processors are configured to determine the presence of the current source based upon a first magnetic vector and a second magnetic vector of the plurality of magnetic vectors.

24. A method for navigating a vehicle comprising:
detecting, using a magnetometer, a magnetic vector of a magnetic field;
receiving, using one or more electronic processors, the magnetic vector of the magnetic field from the magnetometer;
determining a presence of an infrastructure current source based upon the magnetic vector;
navigating the vehicle, using a navigation control, to an initial position; and
navigating, using the navigation control, the vehicle based upon the presence of the infrastructure current source and the magnetic vector.

25. The method of claim 24, further comprising navigating the vehicle, using the navigation control, in a pattern over an area.

26. The method of claim 25, further comprising:
receiving a plurality of magnetic vectors from the magnetometer corresponding to reading in the area; and
determining a maximum magnitude from the plurality of magnetic vectors, wherein the maximum magnitude corresponds to a location of the current source.

27. The method of claim 26, wherein the location of the vehicle is a position directly above the current source.

28. The method of claim 27, further comprising:
receiving a second plurality of real-time magnetic vectors from the magnetometer;
determining a course correction for the vehicle based upon the second plurality of magnetic vectors.

29. The method of claim 28, wherein the vehicle is a flying vehicle.

30. The method of claim 29, further comprising:
comparing the second plurality of magnetic vectors to data corresponding to a known magnetic field generated by the current source;
determining a target magnetic field corresponding with a set distance above the power source;
determining altitude adjustment data based upon the comparison; and
adjusting the altitude of the flying vehicle based upon the altitude adjustment data.

31. The method of claim 27, further comprising:
determining a target magnetic field corresponding with a set distance laterally offset from an initial point relative to the current source;
comparing the second plurality of magnetic vectors to data corresponding to a known magnetic field generated by the current source;
determining lateral adjustment data based upon the comparison; and
adjusting the position of the vehicle based upon the lateral adjustment data.

32. A method for navigating a vehicle comprising:
detecting, using a magnetometer, a magnetic vector of a magnetic field;
receiving, using one or more electronic processors, the magnetic vector of the magnetic field from the magnetometer;
determining a presence of an infrastructure current source based upon the magnetic vector; and
navigating, using a navigation control, the vehicle based upon the presence of the infrastructure current source and the magnetic vector;
wherein the vehicle is a ground vehicle.

33. A method for navigating a vehicle comprising:
detecting, using a magnetometer, a magnetic vector of a magnetic field;
receiving, using one or more electronic processors, the magnetic vector of the magnetic field from the magnetometer;
determining a presence of an infrastructure current source based upon the magnetic vector; and
navigating, using a navigation control, the vehicle based upon the presence of the infrastructure current source and the magnetic vector;
wherein the vehicle is a submersible vehicle.

34. A method for navigating a vehicle comprising:
  detecting a plurality of magnetic vectors of a magnetic field using a plurality of magnetometers;
  receiving, using one or more electronic processors, the plurality of magnetic vectors of the magnetic field from the plurality of magnetometers;
  determining a presence of an infrastructure current source based upon the plurality of magnetic vectors; and
  navigating, using a navigation control, the vehicle based upon the presence of the infrastructure current source and the plurality of magnetic vectors.

35. The method of claim 34, wherein determining the presence of the current source is based upon at least two magnetic vectors of the plurality of magnetic vectors.

36. An aerial vehicle with automatic navigation comprising:
  one or more magnetic sensor means spaced apart from each other and each configured to detect magnetic fields generated by stationary infrastructure, such one or more magnetic sensor means determining a magnetic vector based on the magnetic fields, such infrastructure spaced apart from the one or more magnetic sensor means and providing a magnetic signature that is capable of being mapped based on characteristics of the magnetic signature and correlated to sensed magnetic vectors;
  one or more processing means configured to receive the magnetic vector of the magnetic field and determine a presence of infrastructure based upon the magnetic vector; and
  a navigation control configured to automatically navigate the aerial vehicle based upon the infrastructure and its weak magnetic fields detected and determined as magnetic vectors.

37. A non-transitory computer-readable medium having instructions stored thereon, the instructions comprising:
  instructions to detect a magnetic vector of a magnetic field using a magnetometer;
  instructions to receive the magnetic vector of the magnetic field from the magnetometer;
  instructions to determine a presence of a current source based upon the magnetic vector;
  instructions to navigate a vehicle based upon the presence of the current source and the magnetic vector; and
  instructions to navigate to an initial position.

38. The non-transitory computer-readable medium of claim 37, further comprising instructions to navigate the vehicle in a pattern over an area.

39. The non-transitory computer-readable medium of claim 38, further comprising:
  instructions to receive a plurality of magnetic vectors from the magnetometer corresponding to reading in the area; and
  instructions to determine a maximum magnitude from the plurality of magnetic vectors, wherein the maximum magnitude corresponds to a location of the current source.

40. The non-transitory computer-readable medium of claim 39, wherein the location of the vehicle is a position directly above the current source.

41. The non-transitory computer-readable medium of claim 40, further comprising:
  instructions to receive a second plurality of real-time magnetic vectors from the magnetometer;
  instructions to determine a course correction for the vehicle based upon the second plurality of magnetic vectors.

42. The non-transitory computer-readable medium of claim 41, wherein the vehicle is a flying vehicle.

43. The non-transitory computer-readable medium of claim 42, further comprising:
  instructions to compare the second plurality of magnetic vectors to data corresponding to a known magnetic field generated by the current source;
  instructions to determine a target magnetic field corresponding with a set distance above the power source;
  instructions to determine altitude adjustment data based upon the comparison; and
  instructions to adjust the altitude of the flying vehicle based upon the altitude adjustment data.

44. The non-transitory computer-readable medium of claim 40, further comprising:
  instructions to determine a target magnetic field corresponding with a set distance laterally offset from an initial point relative to the current source;
  instructions to compare the second plurality of magnetic vectors to data corresponding to a known magnetic field generated by the current source;
  instructions to determine lateral adjustment data based upon the comparison; and
  instructions to adjust the position of the vehicle based upon the lateral adjustment data.

45. A non-transitory computer-readable medium having instructions stored thereon, the instructions comprising:
  instructions to detect a magnetic vector of a magnetic field using a magnetometer;
  instructions to receive the magnetic vector of the magnetic field from the magnetometer;
  instructions to determine a presence of a current source based upon the magnetic vector; and
  instructions to navigate a vehicle based upon the presence of the current source and the magnetic vector;
  wherein the vehicle is a ground vehicle.

46. A non-transitory computer-readable medium having instructions stored thereon, the instructions comprising:
  instructions to detect a magnetic vector of a magnetic field using a magnetometer;
  instructions to receive the magnetic vector of the magnetic field from the magnetometer;
  instructions to determine a presence of a current source based upon the magnetic vector; and
  instructions to navigate a vehicle based upon the presence of the current source and the magnetic vector;
  wherein the vehicle is a submersible vehicle.

47. A non-transitory computer-readable medium having instructions stored thereon, the instructions comprising:
  instructions to detect a plurality of magnetic vectors of a magnetic field using a plurality of magnetometers;
  instructions to receive the plurality of magnetic vectors of the magnetic field from the plurality of magnetometers;
  instructions to determine a presence of a current source based upon the plurality of magnetic vectors; and
  instructions to navigate a vehicle based upon the presence of the current source and the plurality of magnetic vectors.

48. The non-transitory computer-readable medium of claim 47, wherein determining the presence of the current source is based upon at least two magnetic vectors of the plurality of magnetic vectors.

* * * * *